United States Patent
Im

[19]

[11] Patent Number: 6,031,875
[45] Date of Patent: Feb. 29, 2000

[54] REED-SOLOMON DECODER FOR USE IN ADVANCED TELEVISION

[75] Inventor: Yong-Hee Im, Seoul, Rep. of Korea

[73] Assignee: Daewoo Electronics Co., Ltd., Seoul, Rep. of Korea

[21] Appl. No.: 08/960,232

[22] Filed: Oct. 29, 1997

[30] Foreign Application Priority Data

Oct. 29, 1996 [KR] Rep. of Korea ...................... 96-49690
Oct. 31, 1996 [KR] Rep. of Korea ...................... 96-51202
Nov. 29, 1996 [KR] Rep. of Korea ...................... 96-60085

[51] Int. Cl.[7] .................................................. H04L 23/02
[52] U.S. Cl. .......................................... 375/262; 714/784
[58] Field of Search ..................................... 375/262, 265, 375/243; 714/784, 785, 764, 768, 781, 783

[56] References Cited

U.S. PATENT DOCUMENTS

| | | | |
|---|---|---|---|
| 5,130,900 | 7/1992 | Hsu et al. | 371/37.4 |
| 5,168,509 | 12/1992 | Nkamura et al. | 375/39 |
| 5,379,243 | 1/1995 | Greenberger et al. | 364/746.1 |
| 5,805,616 | 9/1998 | Oh | 371/37.11 |

FOREIGN PATENT DOCUMENTS 0 096 109 A2  12/1983  European Pat. Off. .

*Primary Examiner*—Chi H. Pham
*Assistant Examiner*—Emmanuel Bayard
*Attorney, Agent, or Firm*—Pillsbury Madison & Sutro LLP

[57] ABSTRACT

A Reed-Solomon decoder for use in ATV is disclosed. The Seed-Solomon decoder comprises: a clock generator for generating a faster RS clock as much as t than a symbol clock; a FIFO buffer for latching the received symbol according to the RS clock; a syndrome calculator for calculating syndrome values from the received symbol according to the RS clock; a syndrome selector for selecting one of the syndrome values supplied from the syndrome calculator and "0x00" value according to a syndrome selecting signal; an error locator polynomial calculating unit for calculating coefficients of an error locator polynomial by using the syndrome values supplied from the syndrome selector according to the RS clock and supplying the coefficients and the highest order thereof; an error corrector for generating an error value by using the syndrome values and the coefficients of the error locator polynomial according to the RS clock and supplying an error-corrected recovered symbol by adding the error value to the received symbol supplied from the FIFO buffer; and a controller for generating a plurality of control signals for controlling the syndrome calculator, the syndrome selector, the error locator polynomial calculating unit, and the error corrector.

14 Claims, 15 Drawing Sheets

REED-SOLOMON DECODER FOR USE IN ADVANCED TELEVISION

The present invention relates to an apparatus for decoding and correcting errors present in transmitted or stored data, and more particularly, to Reed-Solomon decoder for decoding and correcting errors in the data encoded by Reed-Solomon code to obtain an original data in Advanced TeleVision (ATV).

It is common that noises which occur during data transmission, storage or recovery data cause errors in the data. Various apparatus employing encoding techniques for encoding the data to be transmitted or stored, having the capability of correcting errors, have been developed in the past.

In such encoding techniques, a set of check bits is appended to a group of message or information bits to form a codeword. The check bits, which are determined by an encoder, are used to detect and correct the errors. In this regard, the encoder essentially treats the message bits as coefficients of a binary message polynomial i(X) and derives the check bits by operating a code generator polynomial g(X) on the message polynomial i(X) by multiplication or division, to thereby provide a codeword polynomial c(X). The code generator polynomial g(X) is selected in accordance to desired properties of a codeword so that the codeword will belong to a particular class of error correcting binary group codes (see, e.g., S. Lin et al., "Error Control Coding: Fundamentals and Applications", Prentice-Hall, 1983).

One class of error correcting codes is well-known BCH (Bose-Chaudhuri-Hocquenghen) codes, which include the Reed-Solomon (RS) code. The mathematical basis of the RS code is explained in the above mentioned reference by Lin et al. and also in Berlekamp, "Algebraic Coding Theory", McGraw-Hill, 1968, which is further referred to in U.S. Pat. No. 4,162,480 issued to Berlekamp. Meanwhile, the decoding of Reed-Solomon error correcting codes requires the calculation of several polynomials with coefficients in a finite Galois field $GF(2^m)$. These polynomials are generally known as a syndrome polynomial S(X), an error locator polynomial σ(X), and an error evaluator polynomial Ω(x).

If roots of the code generator polynomial g(X) of the RS code are 2T consecutive powers of α as in Expression 1, as many as T number of errors can be corrected.

Expression 1.

$$g(X) = \prod_{i=1}^{2T} (X - \alpha^i)$$

where α corresponds to a primitive element in the finite Galois field $CF(2^m)$.

In process of receiving or recovering a transmitted or stored codeword, certain noises are formed in an error pattern in the codeword. In order to deal with the error pattern generated in a codeword encoded by RS code, an error correcting procedure comprising the following four steps is generally utilized.

In discussing the error correcting procedure, reference shall be made to a RS code consisting of codewords containing N number of M-bit (for example, 8 bits) symbols (of which K number of symbols are information symbols and (N–K) number of symbols are check symbols). In such a case, the codeword polynomial c(X) becomes (N–1)th order polynomial and 2T equals to (N–K). In the first error correcting step, 2T number of syndrome values $S_0, S_1, \ldots, S_{2T-1}$ are calculated from the received codeword r(X), i.e., an (N–1)th order polynomial representing the received codeword. The received codeword r(X) is represented as $r_{N-1}X^{N-1} + r_{N-2}X^{N-2} + \ldots + r_1X^1 + r_o$, where $r_j$ is an (N–j)th symbol in a codeword. In the second step, coefficients of the error locator polynomial σ(X) are calculated by using the syndrome polynomial S(X). In the third step, the error locator polynomial σ(X) is solved to obtain its roots, which represent the error location in the received codeword. That is, if substituting a power of the primitive element, $\alpha^{-j}$ to the error locator polynomial σ(X) results in "0" (i.e., $\alpha^{-j}$ becomes the root of σ(X)), an error has occurred in $r_j$, i.e., (N–j)th symbol of the received codeword. In the fourth step, error values $e_j$ are calculated by using the error locations and the syndrome values. Mathematical expressions for the syndrome values and the coefficients of the error locator polynomial are set forth in the above mentioned U.S. Pat. No. 4,162,480. Now, the fourth step will be explained in more detail.

First, the error evaluator polynomial Ω(X) may be expressed by the following Expression 2.

Expression 2.

$$\Omega(X) = \sigma(X) \, S(X)$$

where S(X) is the syndrome polynomial whose coefficients are the syndrome values.

After deriving the error evaluator polynomial Ω(X), an error value $e_j$ may be calculated as in the following Expression 3.

Expression 3.

$$e_j = \alpha^j \frac{\Omega(\alpha^{-j})}{\sigma'(\alpha^{-j})}$$

where σ'(X) is the first derivative of the error locator polynomial σ(X), $\alpha^{-j}$ is the root of the error locator polynomial σ(X) obtained in the third step, and the error values $e_j$ correspond to one of the (N–j)th symbol which is the error location obtained in the third step. That is, after finding the error values, the original codeword can be recovered by adding the error value to the corresponding symbol.

Meanwhile, the specifications of Reed-Solomon code to be defined in ATV can be summarized as follows.

RS (207,187), the error correcting capability t=10 (i.e., 80 bits)

The Reed-Solomon code using a part of the elements in the finite Galois field $GF(2^8)$ The field generator polynomial $f(x) = x^8 + x^4 + x^3 + x^2 + 1$ The code generator polynomial $g(x) = (x+\alpha^0)(x+\alpha^1) \ldots (x+\alpha^{18})(x+\alpha^{19})$ The sync-byte is appended after only the information data is encoded by using the Reed-Solomon code.

Recently, several very large scale integration (VLSI) architectures for implementing Reed-Solomon (RS) decoders have been developed. The existing VLSI Reed-Solomon decoders are for recovering data encoded by Reed-Solomon code, having the error correcting capability t corresponding to a multiple of 8. However, the decoder for the above mentioned Reed-Solomon code to be defined in ATV has not been proposed in hardware.

In view of the foregoing, it is an object of the present invention to provide a Reed-Solomon decoder for decoding and correcting errors in the data encoded by a Reed-Solomon code to be defined in ATV to obtain an original data.

In order to achieve the above object, the present invention provides a Reed-Solomon decoder for use in ATV for decoding and correcting errors in a received symbol encoded by a Reed-Solomon code having an error correcting capability of multiples of 10 (t), comprising:

clock generating means for generating a faster RS clock as much as t times than a symbol clock;

FIFO buffering means for latching the received symbol according to the RS clock;

syndrome calculating means for calculating syndrome values from the received symbol according to the RS clock;

syndrome selecting means for selecting one of the syndrome values supplied from the syndrome calculating means and "0x00" value according to a syndrome selecting signal;

error locator polynomial calculating means for calculating coefficients of an error locator polynomial by using syndrome values supplied from the syndrome selecting means according to the RS clock and supplying the coefficients and the highest order thereof;

error correcting means for generating an error value by using the syndrome values and the coefficients of the error locator polynomial according to the RS clock and supplying an error-corrected recovered symbol by adding the error value to the received symbol supplied from the FIFO buffering means; and controlling means for generating a plurality of control signals for controlling the syndrome calculating means, the syndrome selecting means, the error locator polynomial calculating means, and the error correcting means.

The above and other objects, features, and advantages of the present invention will be apparent from the following detailed description of the preferred embodiments of the invention in conjunction with the accompanying drawings, in which.

Reference will now be made in detail to the present invention, examples of which are illustrated in the accompanying drawings. Wherever possible, the same reference numbers will be used throughout the drawings to refer to the same or like parts.

Figure 1:
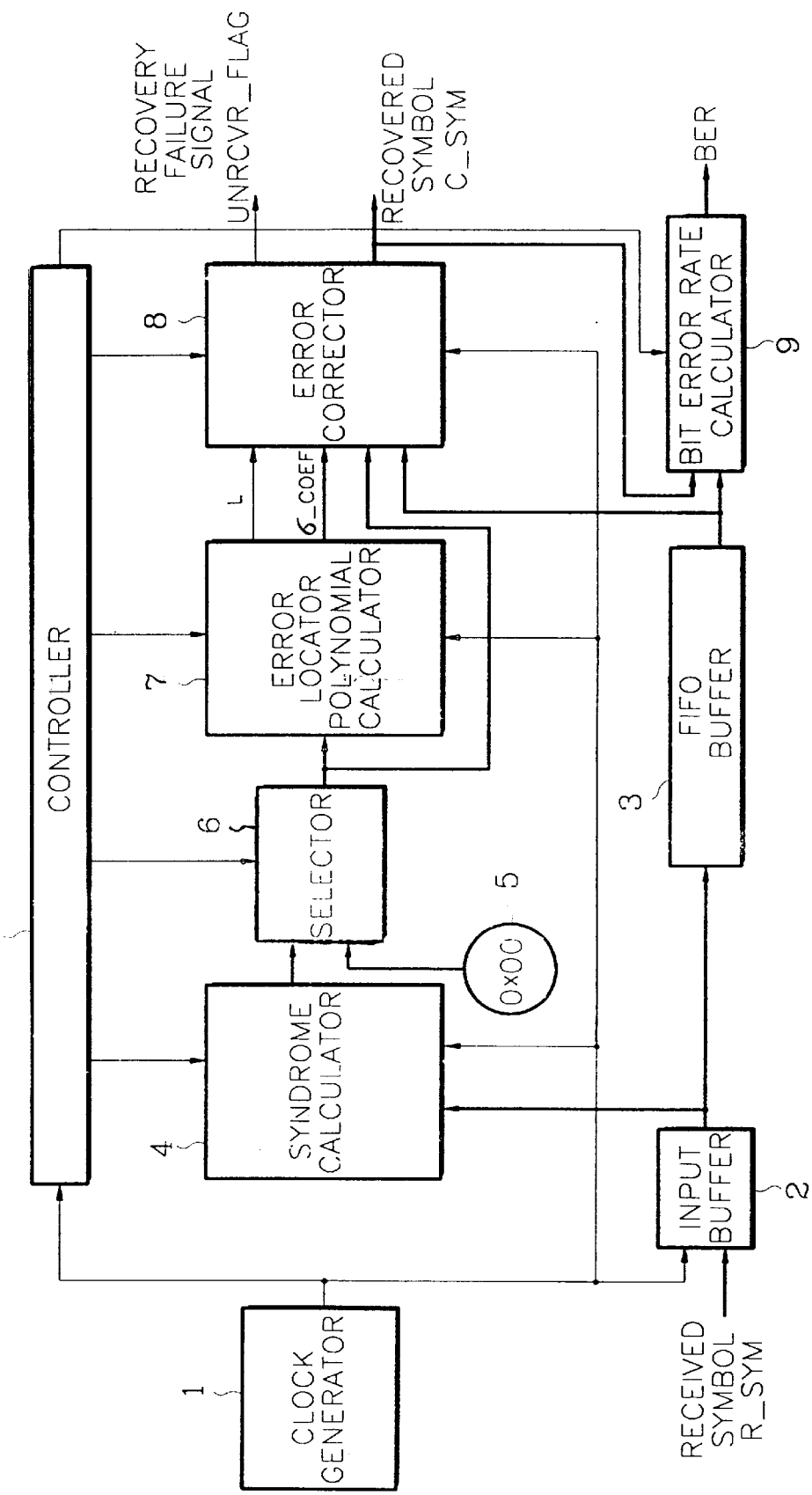
FIG. 1 is a block diagram of a Reed-Solomon decoder for use in ATV in accordance with the present invention.

A Reed-Solomon decoder for use in ATV according to the present invention, as shown in FIG. 1, comprises a clock generator 1, an input buffer 2, a first-in first-out (FIFO) buffer 3, a syndrome calculator 4, a ROM 5, a syndrome selector 6, an error locator polynomial calculating unit 7, an error corrector 8, a bit error rate (BER) calculator 9, and a controller 10.

In FIG. 1, the clock generator 1 generates a faster RS clock RS_CLK as much as 10 times than a symbol clock, and supplies it as a clock signal to each component, namely, to the input buffer 2, the FIFO buffer 3, the syndrome calculator 4, the error locator polynomial calculating unit 7, the error corrector 8, and the BER calculator 9. The input buffer 2 comprises 8 number of D flip-flops connected to 8 bits data bus in parallel, latches a receipt symbol R_SYM encoded by Reed-Solomon code according to the RS clock RS_CLK, and outputs it to the FIFO buffer 3 and the syndrome calculator 4, respectively.

The FIFO buffer 3 latches the receipt symbol R_SYM from the input buffer 2 according to the RS clock RS_CLK, delays it by a predetermined time, and outputs it to the error corrector 8 and the BER calculator 9, respectively. The syndrome calculator 4 calculates syndrome values from the receipt symbol R_SYM outputted from the input buffer 2, generates final syndrome values SYND when all symbols in a codeword R_206 through R_0 are inputted, and outputs it to the syndrome selector 6.

The syndrome selector 6 selects the syndrome values SYND outputted from the syndrome calculator 4 or a "0x00" value stored in the ROM 5 according to a syndrome pass signal SYND_PASS outputted from the controller 10, and outputs it to the error locator polynomial calculating unit 7 and the error corrector 8, respectively. The error locator polynomial calculating unit 7 calculates a coefficient σ_COEF of an error locator polynomial σ(X) by using the syndrome values SYND outputted from the syndrome selector 6, and outputs the coefficient σ_COEF of the error locator polynomial σ(X) and the highest order L of the error locator polynomial σ(X) to the error corrector 8.

The error corrector 8 generates an error value $e_i$ by using the syndrome values SYND from the syndrome selector 6 and the coefficient σ_COEF of the error locator polynomial σ(X) from the error locator polynomial calculating unit 7, and outputs an error-corrected recovered symbol C_SYM by adding the error value $e_i$ to the receipt symbol R_SYM from the FIFO buffer 3. Simultaneously, the error corrector 8 outputs a recovery failure signal UNRCVR_FLAG if the highest order L of the error locator polynomial σ(X) is larger than an error correcting capability t.

The BER calculator 9 calculates a bit error rate by comparing the receipt symbol R_SYM to the recovered symbol C_SYM. The controller 10 generates and outputs various control signals for controlling the syndrome calculator 4, the syndrome selector 6, the error locator polynomial calculating unit 7, the error corrector 8, and the BER calculator 9.

Next, referring to FIGS. 2 to 15, operations of each constituent of the present invention illustrated in FIG. 1 will be described in detail.

Figure 2:
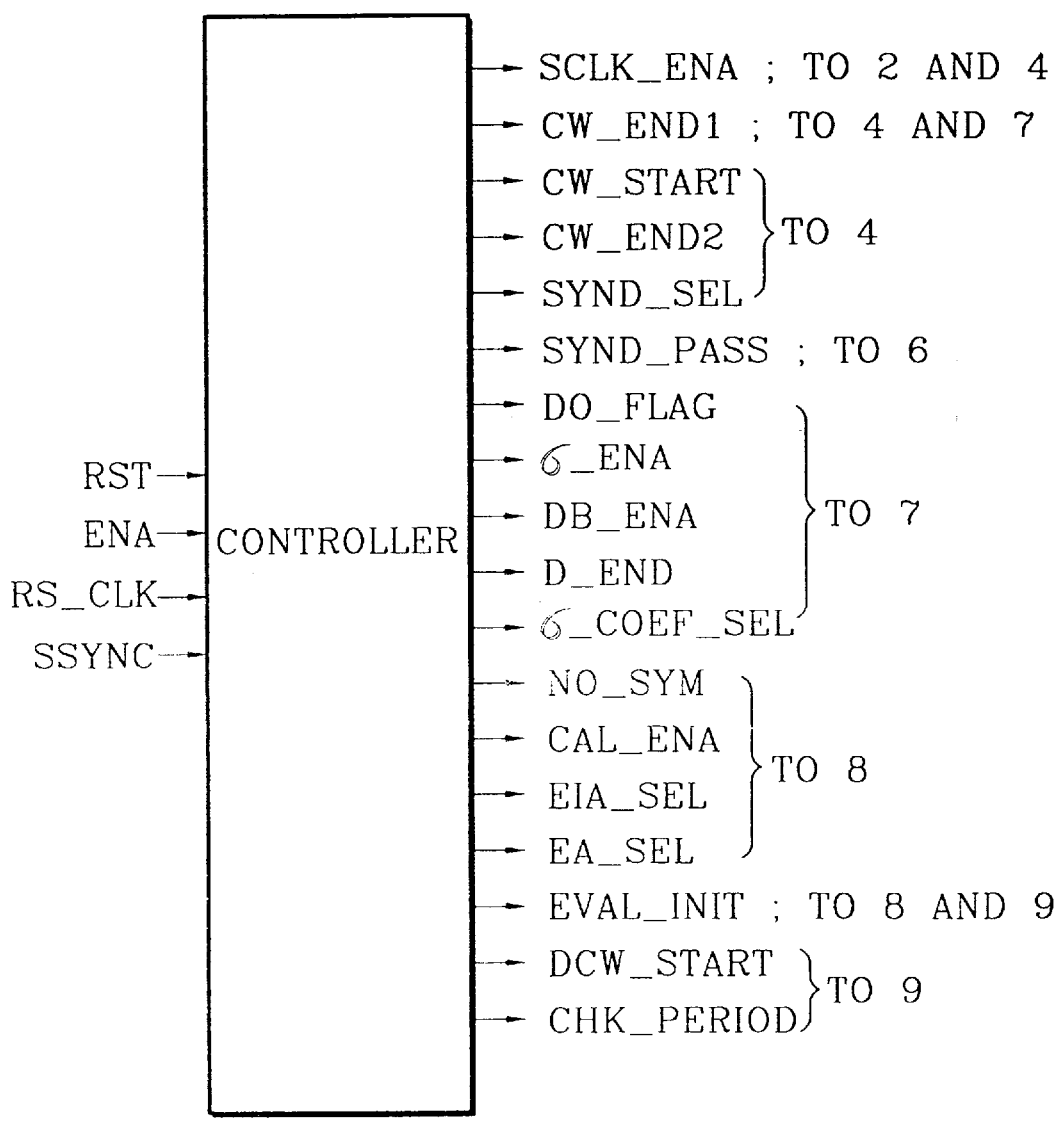
FIG. 2 is a view illustrating input/output signals of the controller shown in FIG. 1.

The controller 10, as shown in FIG. 2, receives a reset signal RST, an enable signal ENA, a symbol synchronization signal SSYNC provided from the outside, and a RS clock RS_CLK provided from the clock generator 1 to generate a plurality of control signals. Among the control signals, a symbol enable signal SCLK_ENA is supplied to the input buffer 2 and the syndrome calculator 4, a first codeword end signal CS_END1 is supplied to the syndrome calculator 4 and the error locator polynomial calculating unit 7, and a second codeword end signal CW_END2 and a syndrome selecting signal SYND_SEL are supplied to the syndrome calculator 4. Further, a syndrome pass signal SYND_PASS is supplied to the syndrome selector 6. A discrepancy zero signal D0_FLAG, a discrepancy end signal D_END, an error locator polynomial enable signal σ_ENA, a discrepancy enable signal D_ENA, a coefficient selecting signal σ_COEF_SEL, and a recovery failure reset signal UNRCVR_FLAG_RST are supplied to the error locator polynomial calculating unit 7. Furthermore, a symbol number signal N0_SYM, a calculation initialization signal CAL_FIRST, a calculation enable signal CAL_ENA, a symbol reset signal RST_SYM, an initial root selecting signal EIA_SEL, and an update root selecting signal EA_SEL are supplied to the error corrector 8, and an evaluation start signal EVAL_INIT is supplied to the error corrector 8 and the BER calculator 9, a discrepancy codeword start signal DCW_START and a check period signal CHK_PERIOD are supplied to the BER calculator 9.

Figure 3:
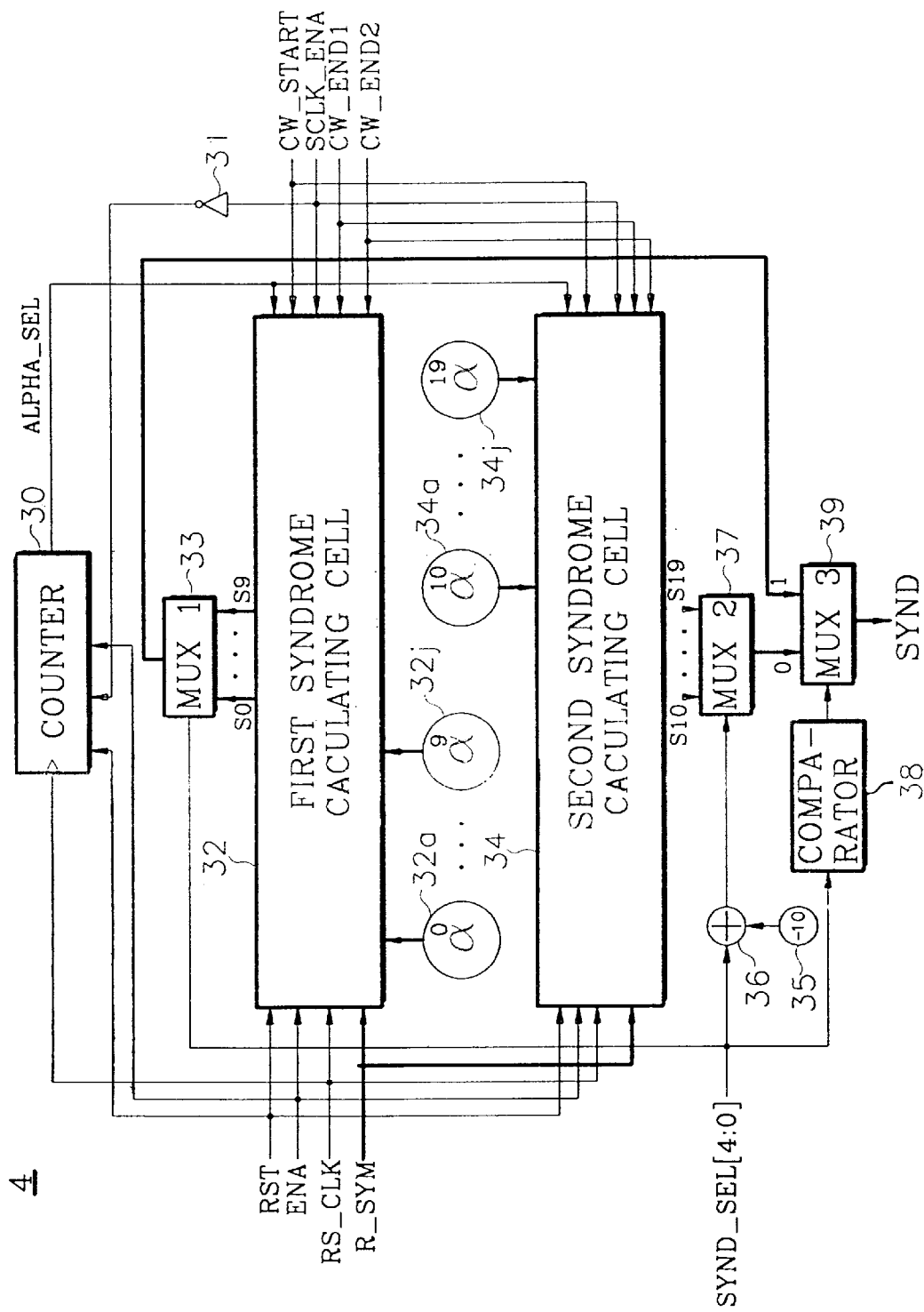
FIG. 3 is a block diagram of the syndrome calculator shown in FIG. 1.

FIG. 3 shows a circuit diagram according to an embodiment of the syndrome calculator 4 illustrated in FIG. 1. The syndrome calculator 4 comprises a counter 30, an inverter 31, a first syndrome calculating cell 32, a first sorting unit 32a~32j, a first multiplexer 33, a second syndrome calculating cell 34, a second storing unit 34a~34j, a third storing unit 35 for storing "−10", an adder 36, a second multiplexer 37, a comparator 38, and a third multiplexer 39.

In FIG. 3, the counter 30, as a 4-bit counter, is synchronized with the RS clock RS_CLK to perform counting, and outputs the counted value as alpha root selecting signal ALPHA_SEL. The inverter 31 inverts the symbol enable signal SCLK_ENA, and supplies the inverted signal to a clear terminal of the counter 30. The first syndrome calculating cell 32 operates by being synchronized with the RS clock RS_CLK, receives the receipt symbol R_SYM, calculates a syndrome value by using an alpha root $\alpha^i$ stored in the first storing unit 32a~32j according to the alpha root selecting signal ALPHA_SEL, and outputs 10 syndrome values $S_0$ to $S_9$ to the first multiplexer 33. The first multiplexer 33 selects and outputs sequentially the syndrome values calculated from the first syndrome calculating cell 32 according to the syndrome selecting signal SYND_SEL. The second syndrome calculating cell 34 also operates by being synchronized with the RS clock RS_CLK, receives the receipt symbol R_SYM, and calculates a syndrome value by using the alpha root $\alpha^i$ stored in the second storing unit 34a~34j according to the alpha root selecting signal ALPHA_SEL, and outputs 10 syndrome values $S_{10}$ to $S_{19}$ to the second multiplexer 37. The adder 36 adds a value "−10" stored in the third storing unit 35 to the syndrome selecting signal SYND_SEL, and outputs the result as a selecting signal of the second multiplexer 37. The second multiplexer 37 selects and outputs sequentially the calculated syndrome values $S_{10}$ to $S_{19}$ from the second syndrome calculating cell 34 according to an output from the adder 36. The comparator 38 compares the syndrome selecting signal SYND_SEL to a predetermined reference signal "9", outputs "0" when the syndrome selecting signal is greater than "9", whereas outputs "1" when it is less than "9". The third multiplexer 39 selects an output from the first multiplexer 33 if an output from the comparator 38 is "1", whereas an output from the second multiplexer 37 is selected if the output is "0", and outputs the selectant as the syndrome value SYND. Namely, the third multiplexer 39 outputs sequentially the syndrome values $S_0$ to $S_{19}$ according to the syndrome selecting signal SYND_SEL.

Figure 4:
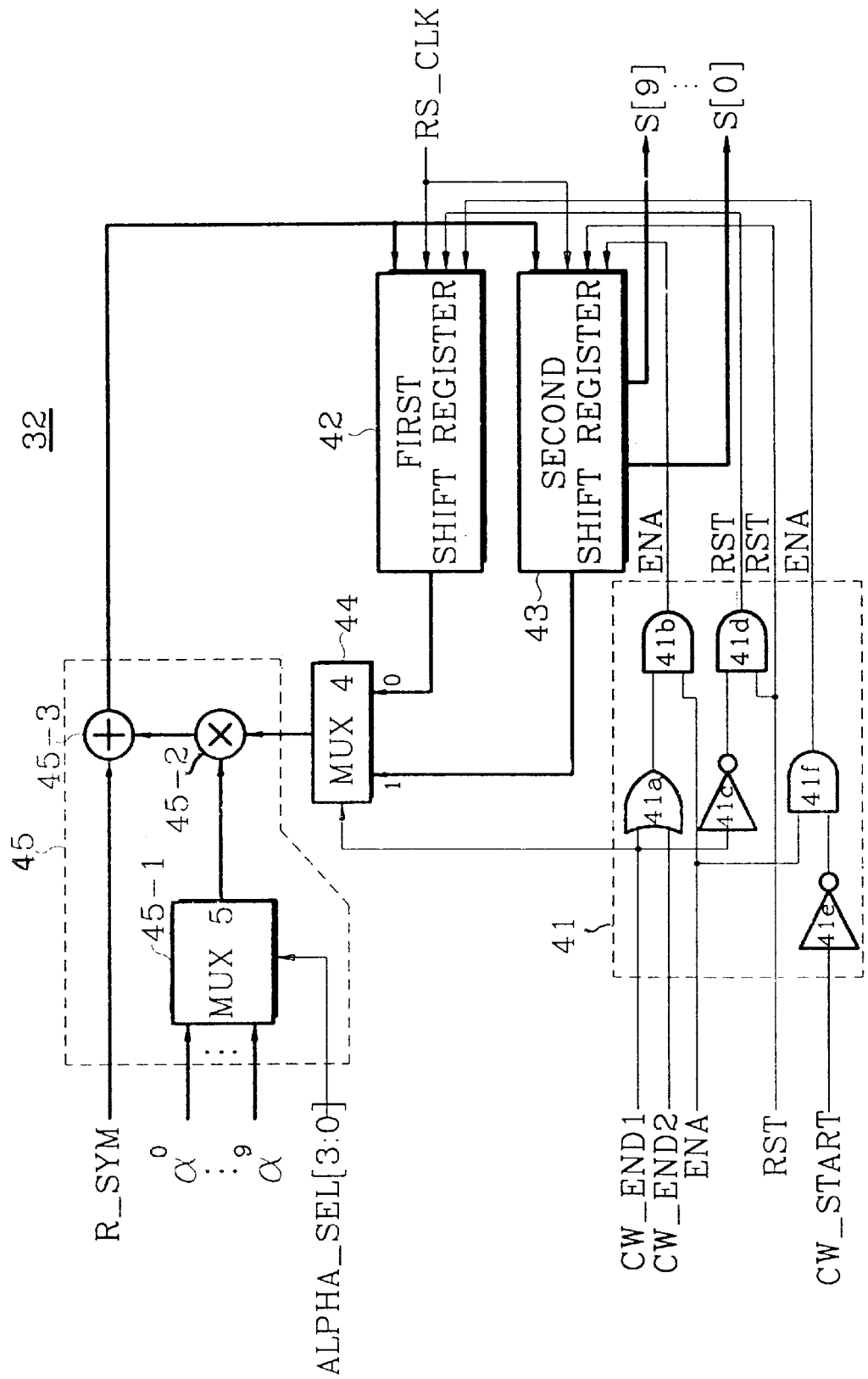
FIG. 4 is a block diagram of the syndrome calculating cell shown in FIG. 3.

In FIG. 3, a structure of the first syndrome calculating cell 32 is identical with the second syndrome calculating cell 34 and the detailed circuit diagram is shown in FIG. 4.

The first syndrome calculating cell 32 shown in FIG. 4 comprises a control signal generator 41, a first shift register 42, a second shift register 43, a fourth multiplexer 44, and a syndrome term operator 45. In addition, the control signal generator 41 comprises one OR gate 41a, three AND gates 41b, 41d, and 41f, and two inverters 41c and 41e. The syndrome term operator 45 comprises a fifth multiplexer 45-1, a Galois multiplier 45-2, and a Galois adder 45-3.

In FIG. 4, the receipt symbol R_SYM forms one codeword from the highest order symbol R_206 to the lowest order symbol R_0 received in order, after receiving a non-coded synchronization byte SYNCBYTE. Accordingly, the codeword start signal CW_START is generated as 'high' during the symbol clock period for receiving the synchronization byte, the first codeword end signal CW_END1 is generated as 'high' during the symbol clock period for receiving the lowest order symbol R_0, and the second codeword end signal CW_END2 is generated as 'high' during the symbol clock period for receiving a second symbol R_1 from the last.

In the control signal generator 41, the first OR gate 41a performs a logical OR operation for signals provided from the controller (the reference numeral 10 in FIG. 1), namely the first codeword end signal CW_END1 and the second codeword end signal CW_END2. The first AND gate 41b performs a logical AND operation for an output signal from the first OR gate 41a and an enable signal ENA, and supplies the result as an enable signal ENA to the second shift register 43. A reset signal RST from the outside is supplied as a reset signal RST to the second shift register 43. The first inverter 41c inverts the first codeword end signal CW_END1. The second AND gate 41d performs a logical AND operation for an output signal from the first inverter 41c and the reset signal RST from the outside, and supplies the result as the reset signal RST to the first shift register 42. The second inverter 41e inverts the codeword start signal CW_START supplied from the controller (the reference numeral 10 of FIG. 1). The third AND gate 41f performs a logical AND operation for an output signal from the second inverter 41e and the enable signal ENA from the outside, and supplies the result as the enable signal ENA to the first shift register 42.

The first shift register 42 stores 10 intermediate syndrome values, which are connected to 8-bit data bus. The first shift register 42, is in an enable state when the first symbol R_206 to the second symbol R_1 from the last of the codeword are inputted. It receives the intermediate syndrome value outputted from the syndrome term operator 45 according to the RS clock RS_CLK, shifts and supplies it to the fourth multiplexer 44.

The second shift register 43 stores 10 syndrome values. The second shift register 43, is in an enable state when the second symbol R_1 from the last to the last symbol R_0 of the codeword are inputted. It receives the syndrome value outputted from the syndrome term operator 45 according to the RS clock RS_CLK, shifts and outputs it to the fourth multiplexer 44, and outputs the final syndrome values $S_0$~$S_9$ to the syndrome selector (the reference numeral 6 in FIG. 1).

The fourth multiplexer 44, according to the first codeword end signal CW_END1 supplied from the controller (the reference numeral 10 in FIG. 1), selects the output value of the first shift register 42 when the first symbol R_206 to the second symbol R_1 from the last of the codeword are inputted, whereas it selects the output value of the second shift register 43 when the last symbol is inputted, to output the output values to the syndrome term operator 45.

In the syndrome term operator 45, the fifth multiplexer 45-1 selects sequentially roots $\alpha^0 \sim \alpha^9$ of a code generator polynomial g(x) according to the alpha root selecting signal ALPHA_SEL, and outputs them. The Galois multiplier 45-2 receives the alpha root outputted from the fifth multiplexer 45-1 and the intermediate syndrome value outputted from the fourth multiplexer 44, and performs a Galois multiplication operation in RS clock RS_CLK units. The Galois adder 45-3 performs a Galois addition operation for the value outputted from the Galois multiplier 45-2 and the receipt symbol R_SYM inputted in symbol units, in RS clock RS_CLK units.

Next, in the first and second syndrome calculating cells 32 and 34 of FIG. 4, a syndrome calculation process of Reed-Solomon encoded receipt symbols R_206~R_0 will be described in detail.

During the first symbol period, the fourth multiplexer 44 selects initial values "0, 0, . . . , 0" outputted from the first shift register 42 by the first codeword end signal CW_END1, and outputs them to the Galois multiplier 45-2 of the syndrome term operator 45. The Galois multiplier 45-2 operates in RS clock RS_CLK units, performs a Galois multiplication operation for "0, 0, . . . , 0" outputted from the fourth multiplexer 44 and the alpha roots $\alpha^0 \sim \alpha^9$ stored in the ROMs (the reference numerals 32a~32j in FIG. 3), and outputs the result, "0, 0, . . . , 0" to the Galois adder 45-3. The Galois adder 45-3 performs a Galois addition operation for the first symbol R_206 and the value "0, 0, . . . , 0" outputted from the Galois multiplier 45-2, and stores the result, "R_206, R_206, . . . , R_206" in the first shift register 42.

During the second symbol period, the fourth multiplexer 44 selects the values "R_206, R_206, . . . , R_206" outputted from the first shift register 42 by the first codeword end signal CW_END1, and outputs them to the Galois multiplier 45-2 of the syndrome term operator 45. The Galois multiplier 45-2 operates in RS clock RS_CLK units, performs a Galois multiplication operator for the values "R_206, R_206, . . . , R_206" outputted from the fourth multiplexer 44 and the alpha roots $\alpha^0 \sim \alpha^9$, respectively, and outputs the result, "R_206×$\alpha^0$, R_206×$\alpha^1$, . . . , R_206×$\alpha^9$" to the Galois adder 45-3. The Galois adder 45-3 performs a Galois addition operation for the second symbol R_205 and the values "R_206×$\alpha^0$, R_206×$\alpha^1$, . . . , R_206×$\alpha^9$" outputted from the Galois multiplier 45-2, and stores the result, "R_206×$\alpha^0$+R_205, R_206×$\alpha^1$+R_205, R_206×$\alpha^2$+R_205, . . . , R_206×$\alpha^9$+R_205" in the first shift register 42.

In the same manner, during the third symbol clock period for which the third symbol R_204 is inputted, the values "(R_206×$\alpha^0$+R_205)$\alpha^9$+R_204, (R_206×$\alpha^1$+R_205)$\alpha^1$+R_204, . . . , (R_206×$\alpha^9$+R_205)$\alpha^9$+R_204" are stored in the first shift register 42.

In the above process, the intermediate syndrome value stored in the first shift register 42 is updated continuously until the second symbol R_1 from the last of one codeword is inputted.

Meanwhile, during the symbol clock period for which the second symbol $R_{13}1$ from the last of the codeword is inputted, the second shift register 43 is in enable state, and the intermediate syndrome values calculated by updating from the first symbol R_206 to the second symbol R_1 from the last are stored in the second shift register 43.

During this time, the fourth multiplexer 44 selects the intermediate syndrome value stored in the second shift register 43 by the first codeword end signal CW_END1, and outputs it to the Galois multiplier 45-2. The Galois multiplier 45-2 which operates in RS clock RS_CLK units, performs a Galois multiplication operation for the intermediate syndrome value of the second shift register 43 outputted from the fourth multiplexer 44 and the alpha roots $\alpha^0 \sim \alpha^9$, respectively, to store the result in the second shift register 43. Accordingly, the final syndrome value calculated from the first symbol R_206 to the last symbol R_0 is stored in the second shift register 43. At this time, the first shift register 42 is reset to store the syndrome value for the next codeword. Namely, if all symbols to the last are inputted, the syndrome values S[0], S[1], . . . , S[9] for one codeword stored in the second shift register 43 are expressed by the following mathematical expression.

Expression 4.

$$S[0]=((R_{206}\alpha^0+R_{205})\alpha^0+\ldots+R_1)\alpha^0+R_0$$

$$S[1]=((R_{206}\alpha^1+R_{205})\alpha^1+\ldots+R_1)\alpha^1+R_0$$

$$S[9]=((R_{206}\alpha^9+R_{205})\alpha^9+\ldots+R_1)\alpha^9+R_0$$

Figure 5:
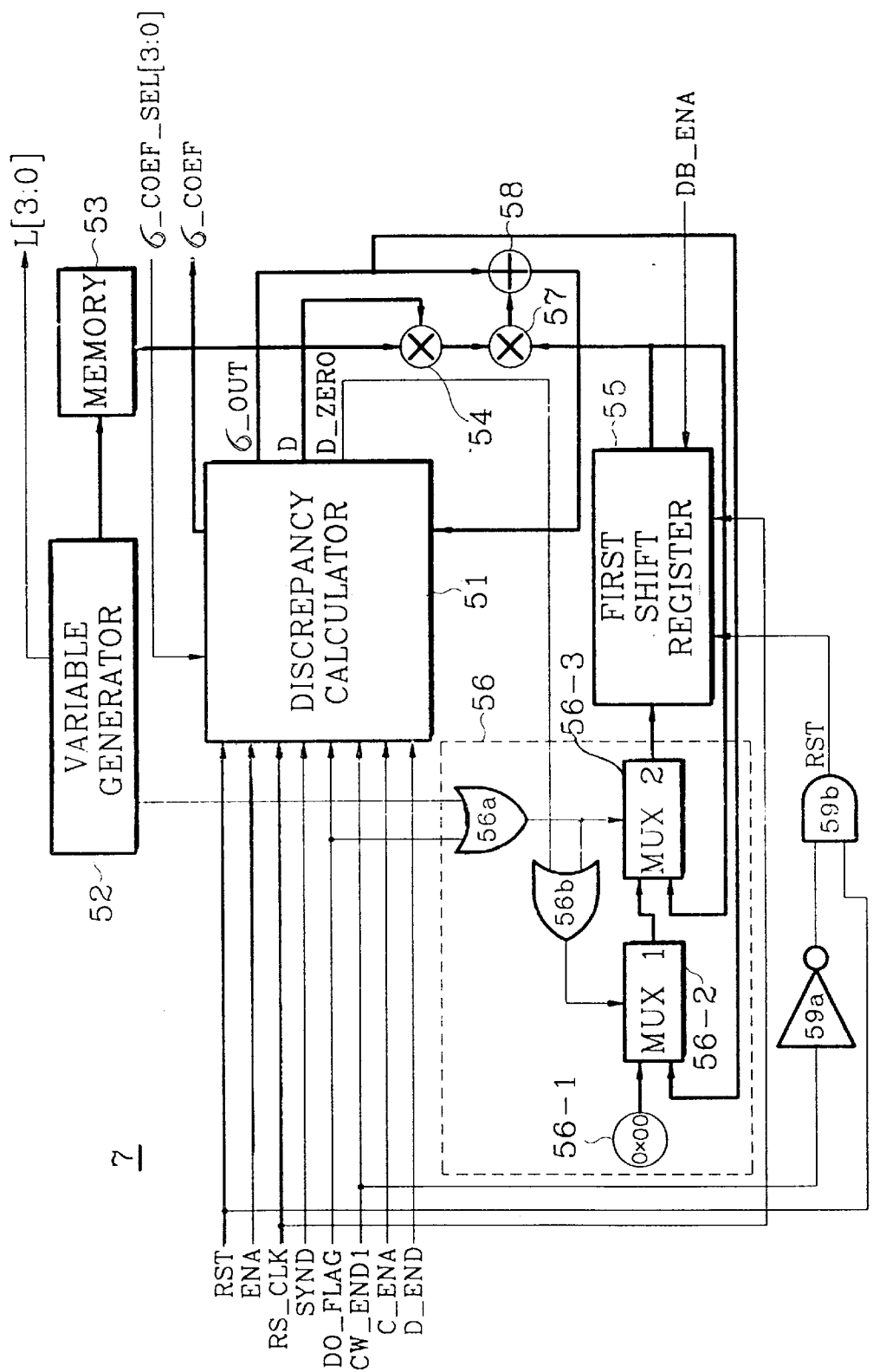
FIG. 5 is a block diagram of the error locator polynomial calculating unit shown in FIG. 1.

FIG. 5 shows a circuit diagram according to an embodiment of the error locator polynomial calculating unit 7 illustrated in FIG. 1. The error locator polynomial calculating unit 7 comprises a discrepancy calculator 51, a variable generator 52, a memory 53 for storing a look-up table, a first Galois multiplier 54, a first shift register 55, a selector 56, a second Galois multiplier 57, a first Galois adder 58, an inverter 59a, and an AND gate 59b, In addition, the selector 56 comprises a first OR gate 56a, a second OR gate 56b, a ROM 56-1 for storing "0x00", a first multiplexer 56-2, and a second multiplexer 56-3.

Next, a Recursive Berlekamp Algorithm (RBA), which is applied to the error locator polynomial calculating unit 7 illustrated in FIG. 5 will be described in detail.

In case of the Reed-Solomon code for performing the error correction as much as the number of t, which has roots less than the number t, an error locator polynomial can be obtained by the following mathematical expression 5 derived by the Berlekamp Algorithm.

Expression 5.

$$\sigma(X)=(1+\alpha^{i_1}X)(1+\alpha^{i_2}X)\ldots(1+\alpha^{i_t}X)$$

The RBA repeats the following 4 steps.
Step 1: Setting an initial condition $$\sigma_0(X)=1,\ B_0(X)=1,\ k_0=0,\ L_0=0,\ b_0=1$$

Here, the $\sigma_0(X)$ is an initial value of the error locator polynomial $\sigma(X)$, the $B_0(X)$ is an initial value of the intermediate value B(X), the $L_0$ is an initial value of L (an order of a practical error locator polynomial $\sigma(X)$), the $k_0$ is an initial value of k (an order of a variable X), and the $b_0$ is an initial value of a late discrepancy b.

Meanwhile, t+1 number of registers including invariables are required to store coefficients of the error locator polynomial $\sigma(X)$, which have t number of roots. The order L of the error locator polynomial $\sigma(X)$ increases one by one as occasion demands an increase of the order when updating the error locator polynomial $\sigma(X)$.

In addition, B(X), k, b values are used for updating the error locator polynomial σ(X).

Step 2: Calculating Discrepancy

In (N, N−2t) code, the discrepancy $d_N$ is calculated 2t times.

An initial value $d_0$ of the discrepancy is equal to the syndrome value $S_0$, and remaining discrepancies except the initial value can be calculated by the following mathematical expression 6.

Expression 6.

$$d_N = S_N + \sum_{i=1}^{L} \sigma_i S_{N-1} \quad (1 \leq N)$$

In the above mathematical expression 6, $d_N$ represents discrepancy, $\sigma_i$ is a coefficient of the syndrome polynomial, and $S_N$ and $S_{N-1}$ are syndrome values.

Step 3: Updating

According to the following conditions, an update is performed for three cases.

Case 1: $d_N=0$
→increasing k as much as "1"
Case 2: $d_N \neq 0$, $2L_N \leq N$
→$\sigma_{N+1}(X)=\sigma_N(X)-d_N b_N^{-1} X^k B_N(X)$
→$L_{N+1}=N+1-L_N$
→k=1
→$B_{N+1}(X)=\sigma_N(X)$
→$b_{N+1}=d_N$
Case 3: $d_N \neq 0$, $2L_N \geq N$
→$\sigma_{N+1}(X)=\sigma_N(X)-d_N b_N^{-1} X^k B_N(X)$
→increasing k as much as "1"

Step 4: Performing the above Step 2 repeatedly until N=2t

Next, referring to FIG. 5, an operation of the error locator polynomial calculating unit 7 will be described in detail.

A discrepancy zero flag D0_FLAG is a "high" signal when calculating a first discrepancy $d_0$, a discrepancy zero signal D_ZERO is a "high" signal when the calculated discrepancy is "0", and a case 3 flag signal CASE3_FLAG is a "high" signal when $d_N \neq 0$, $2L_N \geq N$ (here, $d_N$ represents discrepancy, and $L_N$ represents the highest order of the error locator polynomial σ(X)).

The discrepancy calculator 51 receives a syndrome value outputted from the syndrome calculator (the reference numeral 4 in FIG. 1) and the updated error locator polynomial σ_IN, performs the step 2 of the RBA to calculate 20 discrepancies d from $d_0$ to $d_{19}$. In addition, the discrepancy calculator 51 delays the error locator polynomial σ_IN updated and outputted in the first Galois adder 58 during a predetermined time, and outputs it as an error locator polynomial σ_OUT. Furthermore, the discrepancy calculator 51 outputs the last updated error locator polynomial σ_OUT as the error locator polynomial σ(X).

The variable generator 52 receives a "D_ZERO" signal, a "D0_FLAG" signal, and a discrepancy d, and outputs an index N of the late discrepancy b to the memory 53. Meanwhile, by performing the step 3 of the RBA, when the current state corresponds to the Case 3, namely $d_N \neq 0$, $2L_N \geq N$, a "CASE3_FLAG" signal is outputted and a practical order L of the error locator polynomial σ(X) is outputted.

The memory 53 receives the index N of the late discrepancy b outputted from the variable generator 52, and outputs a reciprocal $b^{-1}$. The first Galois multiplier 54 performs a Galois multiplication operation for the discrepancy d outputted from the discrepancy calculator 51 and the reciprocal $b^{-1}$ of the late discrepancy b outputted from the memory 53, and outputs the result to the second Galois multiplier 57.

The first shift register 55 is used to obtain a value $X^k B(X)$, and to store the intermediate value for updating the error locator polynomial σ(X). The first shift register 55 shifts and outputs the value outputted from the second multiplexer 56-3 of the selector 56 according to the RS clock RS_CLK, and simultaneously feeds it back.

In the selector 56, the first OR gate 56a outputs a selecting signal SEL2, obtained by combining the "D0_FLAG" signal and the CASE3_FLAG signal, to the second multiplexer 56-3. The second OR gate 56b outputs a selecting signal SEL1, obtained by combining the "D_ZERO" signal and the selecting signal SEL2, to the first multiplexer 56-2. The first multiplexer 56-2 selects the error locator polynomial σ_OUT outputted from the discrepancy calculator 51 or "0×00" stored in the ROM 56-1, according to the selecting signal SEL1, and outputs it to the second multiplexer 56-3. The second multiplexer 56-3 selects the error locator polynomial σ_OUT outputted from the first multiplexer 56-2 or the output from the first shift register 55, according to the selecting signal SEL2, and outputs it to the first shift register 55. Namely, in the selector 56, the Step 3 of the RBA is performed according to the "CASE3_FLAG", D0_FLAG", and "D_ZERO" signals. In other words, the value "0×00" of the ROM 56-1 is selected and outputted to the first shift register 55 for the Case 1. The output σ_OUT of the discrepancy calculator 51 is selected and outputted to the first shift register 55 for the Case 2. A value stored in a 10th terminal of the first shift register 55 is fed back and shifted for the Case 3. Accordingly, the first shift register 55 is updated only if it corresponds to the Case 2. Finally, through the above operations, the first shift register 55 shifts only once for the Case 1. The second shift register (the reference numeral 61 in FIG. 6), the first shift register 55, the order L, and the late discrepancy b are updated for the Case 2, and for the Case 3, the first shift register 55 shifts once and only the second shift register 61 is updated.

The Galois multiplier 57 performs the Galois multiplication operation for the output value from the first Galois multiplier 54 and the output value from the first shift register 55, and outputs the result to the first Galois adder 58. The first Galois adder 58 performs the Galois addition operation for the output value from the second Galois multiplier 57 and the error locator polynomial σ_OUT, and feeds back the result as the updated error locator polynomial σ_IN to the discrepancy calculator 51.

The first inverter 59a inverts the first codeword end signal CW_END1. The first AND gate 59b performs the logical AND operation for a reset signal from the outside and the output signal from the first inverter 59a, and supplies the result as the reset signal RST to the first shift register 55.

Figure 6:
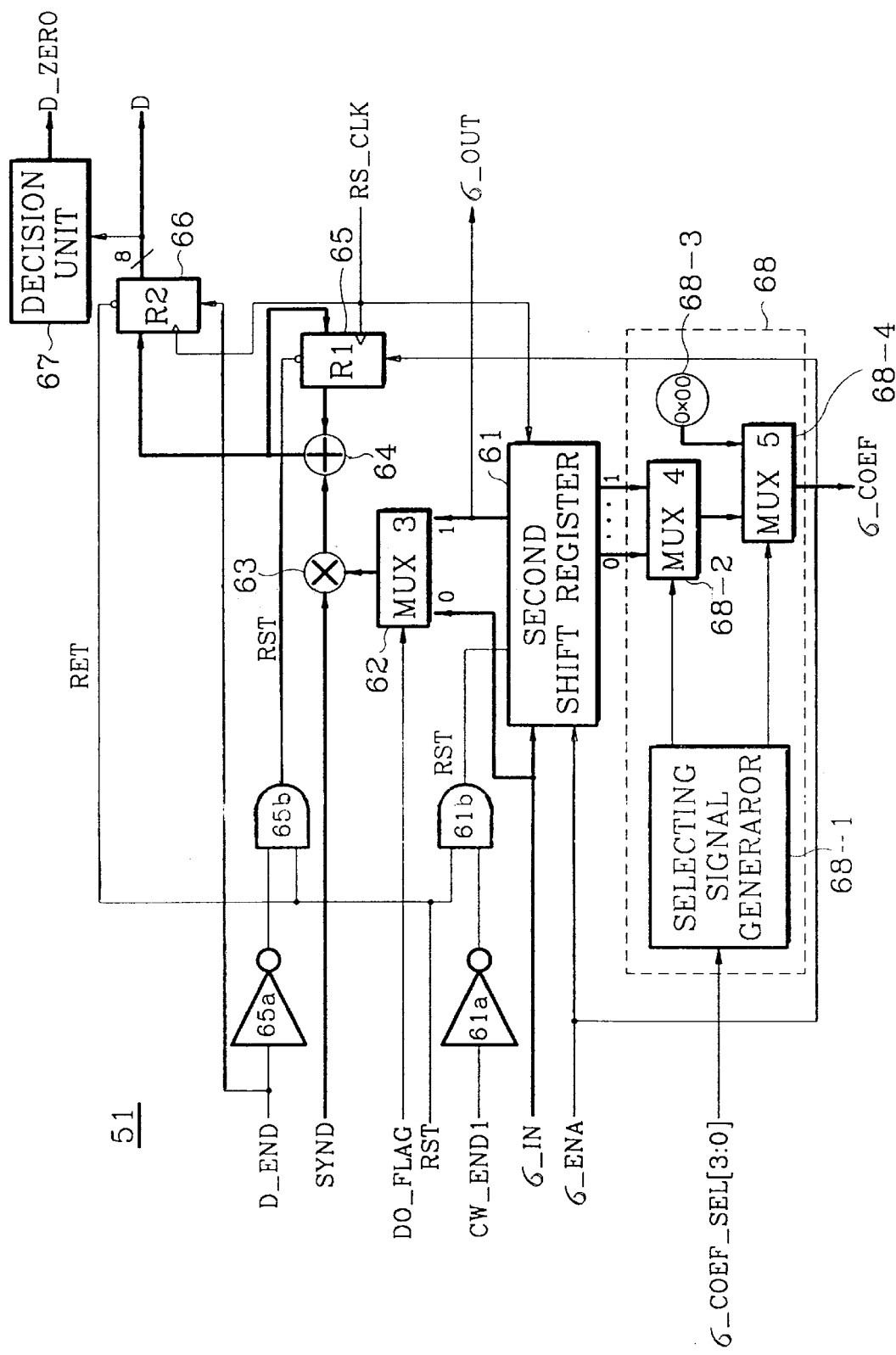
FIG. 6 is a block diagram of the discrepancy calculator shown in FIG. 5.

FIG. 6 shows a circuit diagram according to an embodiment of the discrepancy calculator 51 illustrated in FIG. 5. The discrepancy calculator 51 comprises a second register 61, a second inverter 61a, a second AND gate 61b, a third multiplexer 62, a third Galois multiplier 63, a second Galois adder 64, a feedback vector register 65, a third inverter 65a, a third AND gate 65b, an output vector register 66, a decision unit 67, and a coefficient output unit 68. The coefficient output unit 68 comprises a selecting signal generator 68-1, a fourth multiplexer 68-2, a ROM 68-3 for storing "0×00", and a fifth multiplexer 68-4.

In FIG. 6, the second register 61 comprising 11 registers (=t+1), connected in series shifts and outputs the updated error locator polynomial σ_IN outputted from the first Galois adder 58 according to the RS clock RS_CLK, and outputs the final updated values of one to ten stages in parallel. The outputted value corresponds to the coefficient of the error locator polynomial σ(X).

The third multiplexer 62 outputs selectively the error locator polynomial σ_IN outputted from the first Galois adder 58 or the error locator polynomial σ_OUT shifted and outputted from the second register 61 according to the "D0_FLAG" signal. Namely, the third multiplexer 62 selectively outputs the error locator polynomial σ_OUT shifted and outputted from the second register 61 at "high" D0_FLAG corresponding to the calculation of the first discrepancy $d_0$. Next, the third multiplexer 62 selects the updated outputted error locator polynomial σ_IN at the "low" D0_FLAG corresponding to the calculation of the remaining discrepancies $d_1$ to $d_{19}$, and outputs the selectant to the third Galois multiplier 63.

The third Galois multiplier 63 performs the Galois multiplication operation for the syndrome value SYND outputted from the syndrome calculator (the reference numeral 4 in FIG. 1) and the value outputted from the third multiplexer 62, and outputs the result to the second Galois adder 64. The second Galois adder 64 performs the Galois addition operation for the output value from the third Galois multiplier 63 and the feedback value, and outputs the sum to the feedback vector register 65 and the output vector register 66.

The feedback vector register 65 latches the output value from the second Galois adder 64 according to the RS clock RS_CLK to feed it back to the second Galois adder 64. The third inverter 65a inverts a "D_END" signal. The third AND gate 65b performs the logical AND operation for the reset signal RST from the outside and the output signal from the third inverter 65a, and supplies the result as the reset signal to the feedback vector register 65.

The output vector register 66 enabled by the "D_END" signal, latches the output value from the second Galois adder 64 to output it as the final discrepancy d. The decision unit 67 determines whether the discrepancy outputted from the output vector register 66 is "0" or not, and outputs a high "D_ZERO" signal for the Step 3 of the RBA if "0".

If the coefficient output unit 68, the selecting signal generator 68-1 receives the coefficient selecting signal σ_COEF_SEL, and generates the selecting signals SEL4 and SEL5 for the fourth and fifth multiplexers 68-2 and 68-4. The fourth multiplexer 68-2 outputs selectively one of 10 values outputted in parallel from the second register 61 according to the selecting signal SEL 4. The fifth multiplexer 68-4 selects the value outputted from the fourth multiplexer 68-2 or "0x00" of the ROM 68-3 according to the selecting signal SEL5, and outputs it as the coefficient σ_COEF to the error locator polynomial.

Figure 7:
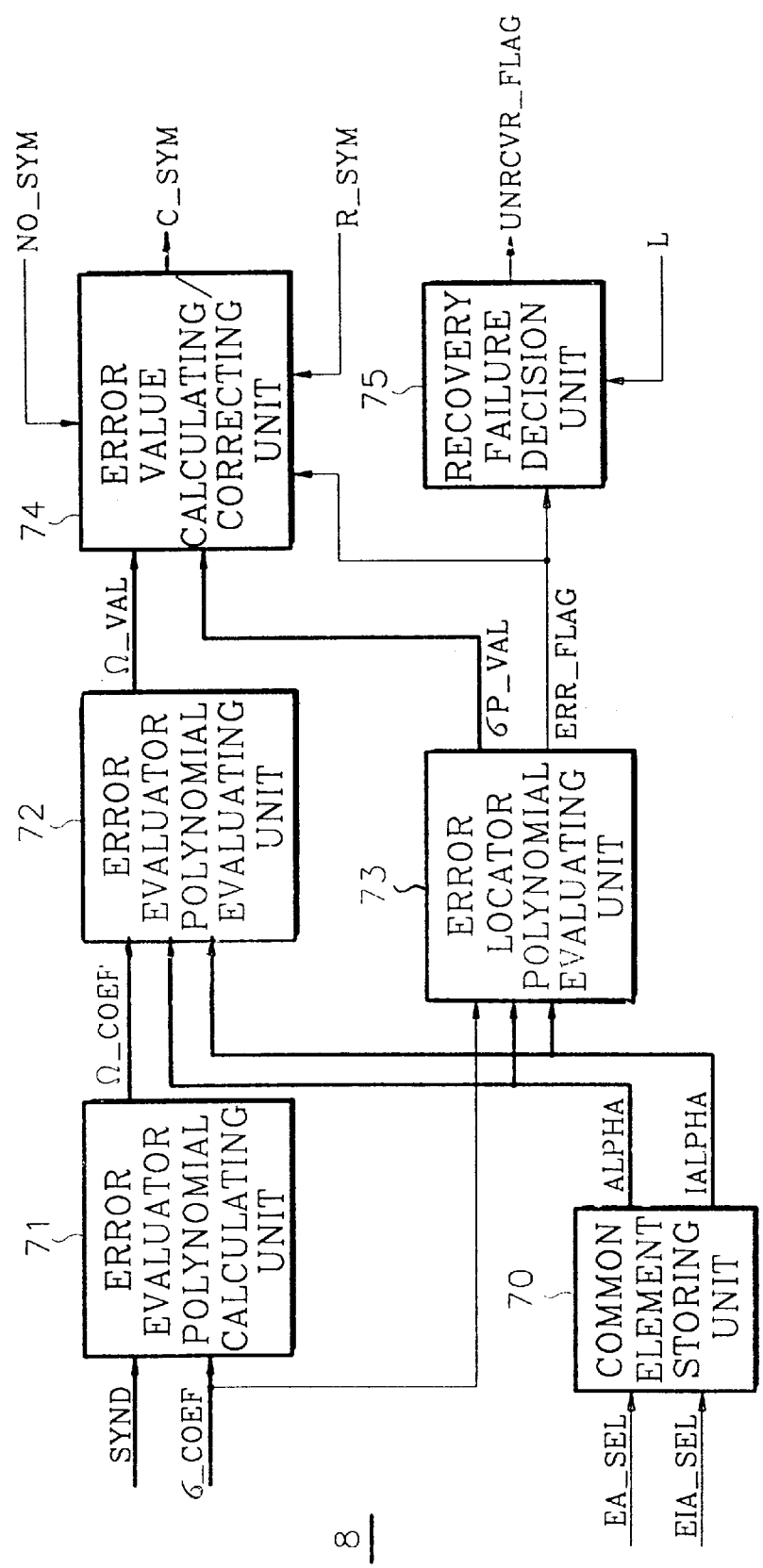
FIG. 7 is a block diagram of the error corrector shown in FIG. 1.

FIG. 7 shows a circuit diagram according to an embodiment of the error corrector 8 illustrated in FIG. 1. The error corrector 8 comprises a common element storing unit 70, an error evaluator polynomial calculating unit 71, an error evaluator polynomial evaluating unit 72, an error locator polynomial evaluating unit 73, an error value calculating/correcting unit 74, and a recovery failure decision unit 75.

In FIG. 7, the common element storing unit 70 stores an initial room ($\alpha^{-N \times 1}$, $1 \leq i \leq t$) corresponding to a reciprocal of a Galois field element for processing an evaluation from the highest order of the Reed-Solomon code and an update root ($\alpha^i$, $1 \leq i \leq t$) corresponding to a Galois field element for updating the order for the next symbol, and provides a root value to process the evaluation of the error evaluator polynomial Ω(X) and the error locator polynomial σ(X).

The error evaluator polynomial calculating unit 71 receives a syndrome value SYND outputted from the syndrome calculator (the reference numeral 4 in FIG. 1) and a coefficient σ_COEF of the error locator polynomial, multiplies the two values and outputs the coefficient Ω_COEF to the error evaluator polynomial.

The error evaluator polynomial evaluating unit 72 evaluates the error evaluator polynomial Ω(X) from the coefficient Ω_COEF of the error evaluator polynomial by using the initial root ($\alpha^{-N \times 1}$, $1 \leq i \leq t$) outputted from the common element storing unit 70 and the Galois field element, the update root ($\alpha^i$, $1 \leq i \leq t$), and outputs the result as an error evaluation value Ω_VAL.

The error locator polynomial evaluating unit 73 evaluates the error locator polynomial σ(X) from the coefficient σ_COEF of the error locator polynomial by using the initial root ($\alpha^{-N \times 1}$, $1 \leq i \leq t$) outputted from the common element storing unit 70 and the Galois field element, the update root ($\alpha^i$, $1 \leq i \leq t$), and outputs the error location signal ERR_FLAG. In addition, the error locator polynomial evaluating unit 73 evaluates a differentiation value of the error locator polynomial σ(X), a differentiation polynomial σ'(X), and outputs the result as a differentiation evaluation value σp_VAL.

The error value calculating and correcting unit 74 receives the differentiation evaluation value σp_VAL and the error evaluation value Ω_VAL, calculates an error value $e_i$ by a Forney algorithm, and outputs the result. In addition, the error value calculating and correcting unit 74 adds the error value $e_i$ to the receipt symbol R_SYM according to the error generation signal ERR_FLAG, and outputs an error-corrected recovered symbol C_SYM.

The recovery failure decision unit 75 determines whether the error-corrected recovered symbol C_SYM is correct, or not, and according to the result, outputs a recovery failure signal UNRCVR_FLAG.

Next, referring to FIGS. 8 to 14, an operation of the error corrector 7 will be described in detail.

Figure 8:
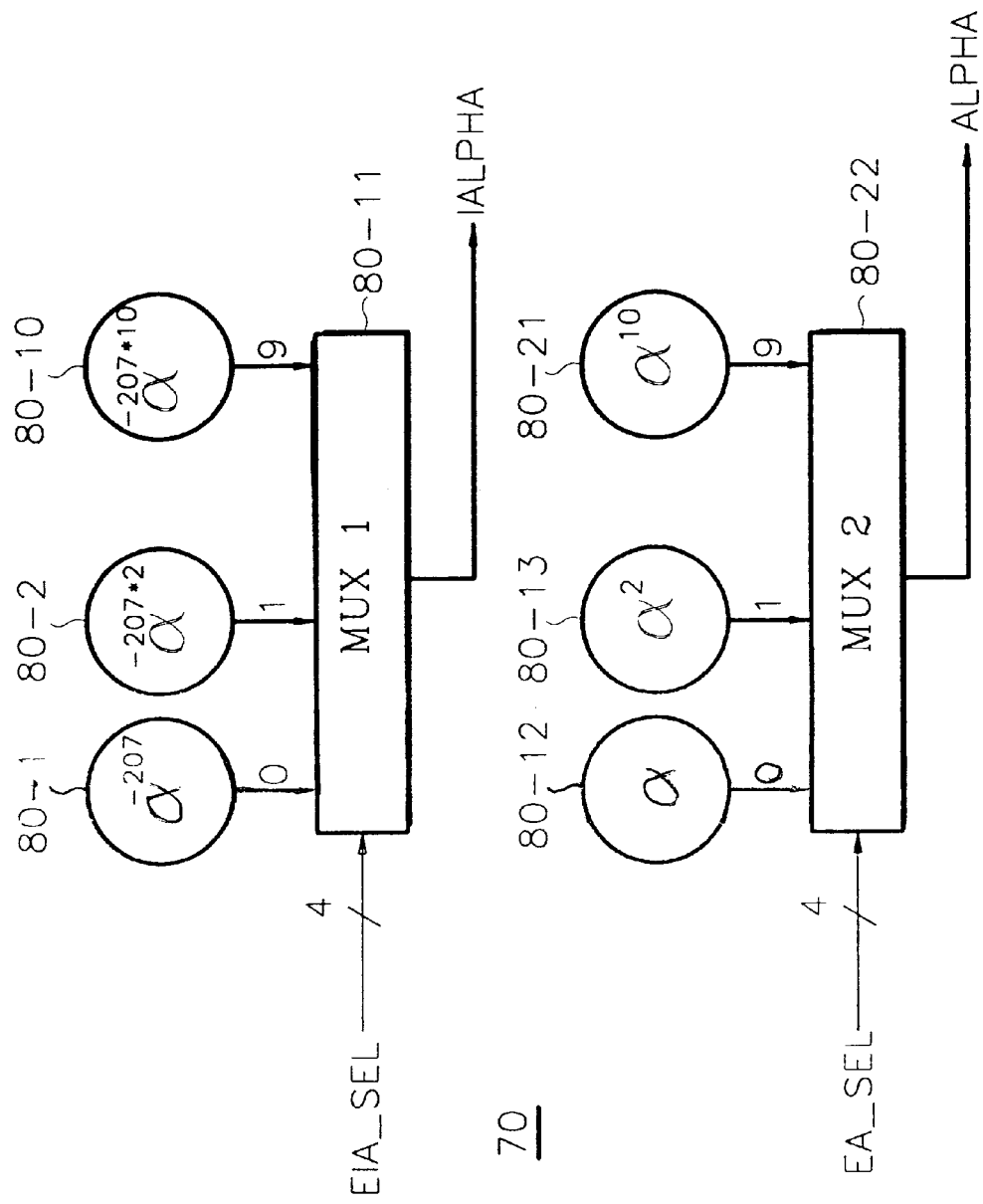
FIG. 8 is a block diagram of the common element storing unit shown in FIG. 7.

FIG. 8 shows a block diagram according to an embodiment of the common element storing unit 70 in FIG. 7. The common element storing unit 70 comprises first ROMs 80-1~80-10, a first multiplexer 80-11, second ROMs 80-12~80-21, and a second multiplexer 80-22.

In FIG. 8, the first ROMs 80-1~80-10 store initial roots 1ALPHA $\alpha^{-207}$, $\alpha^{-207 \times 2}$, $\alpha^{-207 \times 3}$, . . . , $\alpha^{-207 \times 10}$ for initializing an evaluation process. The first multiplexer 80-11 selects and sequentially outputs the initial roots of the ROMs 80-1~80-10 according to the initial root selecting signal EIA_SEL.

The second ROMs 80-11~80-21 store the Galois field element for updating the order, the update roots $\alpha^1$, $\alpha^2$, $\alpha^3$, . . . , $\alpha^{10}$. The second multiplexer 80-22 selects and outputs sequentially the update roots of the ROMs 80-11~80-21 according to the update root selecting signal EA_SEL.

Figure 9:
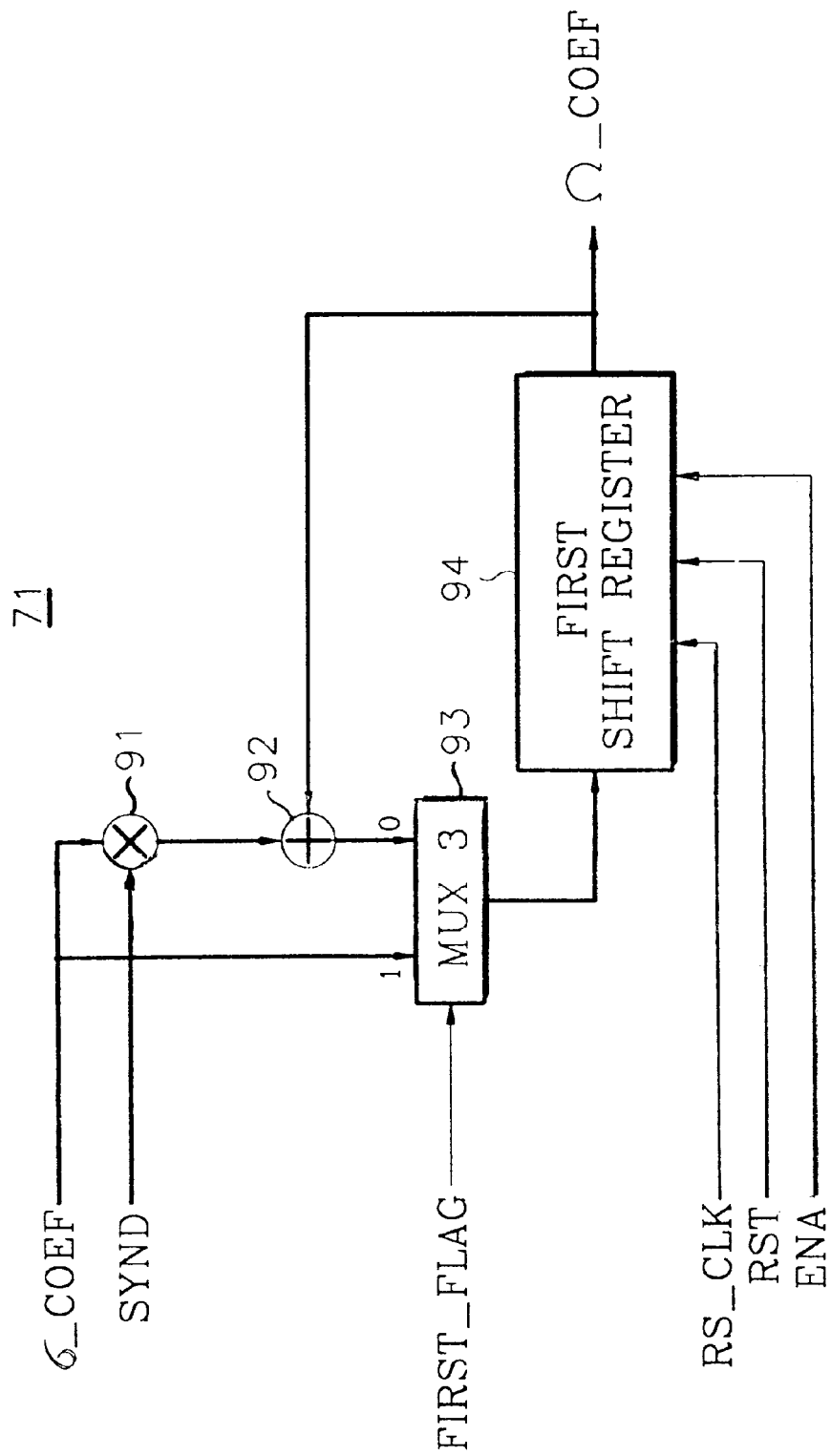
FIG. 9 is a block diagram of the error evaluator polynomial calculating unit shown in FIG. 7.

FIG. 9 shows a block diagram according to an embodiment of the error evaluator polynomial calculating unit 71 in FIG. 7. The error evaluator polynomial calculating unit 71 comprises a Galois multiplier 91, a Galois adder 92, a multiplexer 93, and a shift register 94.

In FIG. 9, the Galois multiplier 91 receives the coefficient σ_COEF of the error locator polynomial and the syndrome value SYND, performs the Galois multiplication operation for them, and outputs the result to the Galois adder 92. The Galois adder 92 performs the Galois addition operation for the output value from the Galois multiplier 91 and the output value from the shift register 94, and outputs the result to the multiplexer 93. The multiplexer 93 selectively outputs the coefficient σ_COEF of the error locator polynomial or the output from the Galois adder 92 according to the initial signal FIRST_FLAG. The shift register 94 for storing coefficients $\Omega 1 \sim \Omega 10$ of the error evaluator polynomial shifts the output from the multiplexer 93 by being synchronized with the RS clock RS_CLK, and feeds back the shifted value to the Galois adder 92. The calculated coefficients of the error evaluator polynomial can be represented by the following table 1.

TABLE 1

$\Omega 0 = 1$
$\Omega 1 = S1 + \sigma 1$
$\Omega 2 = S2 + \sigma 1 \cdot S1 + \sigma 2$
$\Omega 3 = S3 + \sigma 1 \cdot S2 + \sigma 2 \cdot S1 + \sigma 3$
$\Omega 4 = S4 + \sigma 1 \cdot S3 + \sigma 2 \cdot S2 + \sigma 3 \cdot S1 + \sigma 4$
$\Omega 5 = S5 + \sigma 1 \cdot S4 + \sigma 2 \cdot S3 + \sigma 3 \cdot S2 + \sigma 4 \cdot S1 + \sigma 5$
$\Omega 6 = S6 + \sigma 1 \cdot S5 + \sigma 2 \cdot S4 + \sigma 3 \cdot S3 + \sigma 4 \cdot S2 + \sigma 5 \cdot S1 + \sigma 6$
$\Omega 7 = S7 + \sigma 1 \cdot S6 + \sigma 2 \cdot S5 + \sigma 3 \cdot S4 + \sigma 4 \cdot S3 + \sigma 5 \cdot S2 + \sigma 6 \cdot S1 + \sigma 7$
$\Omega 8 = S8 + \sigma 1 \cdot S7 + \sigma 2 \cdot S6 + \sigma 3 \cdot S5 + \sigma 4 \cdot S4 + \sigma 5 \cdot S3 + \sigma 6 \cdot S2 + \sigma 7 \cdot S1 + \sigma 8$
$\Omega 9 = S9 + \sigma 1 \cdot S8 + \sigma 2 \cdot S7 + \sigma 3 \cdot S6 + \sigma 4 \cdot S5 + \sigma 5 \cdot S4 + \sigma 6 \cdot S3 + \sigma 7 \cdot S2 + \sigma 8 \cdot S1 + \sigma 9$
$\Omega 10 = S10 + \sigma 1 \cdot S9 + \sigma 2 \cdot S8 + \sigma 3 \cdot S7 + \sigma 4 \cdot S6 + \sigma 5 \cdot S5 + \sigma 6 \cdot S4 + \sigma 7 \cdot S3 + \sigma 8 \cdot S2 + \sigma 9 \cdot S1 + \sigma 10$ As shown in the table 1, the zero order coefficient $\Omega 0$ of the error evaluator polynomial $\Omega(X)$ is always "1", and it is not necessary to be stored, hence 10 registers are required to store the coefficient of the error evaluator polynomial $\Omega(X)$ instead of 11. Only the syndrome values of the first to tenth syndromes S1 to S are used.

Next, an operation of the error evaluator polynomial calculating unit 71 illustrated in FIG. 9 will be described in detail.

During the first symbol period, coefficients of the first to tenth orders $\sigma 1$ to $\sigma 10$, which are calculated in the error locator polynomial calculating unit (the reference numeral 7 in FIG. 1) are inputted according to the RS clock RS_CLK. According to the initial signal FIRST_FLAG of the controller 10, the multiplexer 93 selects the first to tenth orders of the error locator polynomial, and stores it to the shift register 94.

During the second symbol period, the 0 order coefficient ($\sigma 0 = $"1") of the error locator polynomial is supplied to one input terminal of the Galois multiplier 91, and "S1, S2, S3, S4, S5, S6, S7, S8, S9, S10" order syndromes are inputted in the other input terminal according to the RS clock RS_CLK, to perform the Galois multiplication operation. The Galois adder 92 performs the Galois addition operation for the outputs from the Galois multiplier 91 and the intermediate value from the shift register 94. The multiplexer 93 selects the outputs from the Galois adder 92, and outputs it to the shift register 94. Accordingly, the values stored in the shift register 94 are S1+$\sigma 1$, S2+$\sigma 2$, S3+$\sigma 3$, ..., S9+$\sigma 9$, S10+$\sigma 10$.

During the third symbol period, the first coefficient $\sigma 1$ of the error locator polynomial is supplied to one input terminal of the Galois multiplier 91, and "0, S1, S2, S3, S4, S5, S6, S7, S8, S9" order syndromes are inputted in the other input terminal according to the RS clock RS_CLK. The multiplexer 93 selects the output from the Galois adder 92, and outputs it to the shift register 94. Accordingly, the values stored in the shift register 94 are S1+$\sigma 1$, S2+$\sigma 1 \cdot$S1+$\sigma 2$, S3+$\sigma 1 \cdot$S2+$\sigma 3$, ..., S9+$\sigma 1 \cdot$S8+$\sigma 9$, S10+$\sigma 1 \cdot$S9+$\sigma 10$.

During the fourth symbol period, the second coefficient $\sigma 2$ of the error locator polynomial is maintained, and "0, 0, S1, S2, S3, S4, S5, S6, S7, S8" order syndromes are inputted according to the RS clock RS_CLK. Accordingly, the values of the shift register 94 are S1+$\sigma 1$, S2+$\sigma 1 \cdot$S1+$\sigma 2$, S3+$\sigma 1 \cdot$S2+$\sigma 2 \cdot$S1+$\sigma 3$, ..., S9+$\sigma 1 \cdot$S8+$\sigma 2 \cdot$S7+$\sigma 9$, S10+$\sigma 1 \cdot$S9+$\sigma 2 \cdot$S8+$\sigma 10$.

Continuously, during the last and 11th symbol clocks, the tenth coefficient $\sigma 10$ of the error locator polynomial is maintained, and "0, 0, 0, 0, 0, 0, 0, 0, 0, S1" order syndromes are inputted according to the RS clock RS_CLK. Accordingly, the values of the shift register 94 are the transmissions $\Omega 1 \sim \Omega 10$ shown in the table 1.

Here, according to the syndrome pass signal SYND_PASS of the controller (the reference numeral 10 in FIG. 1), the corresponding syndrome value SYND from the syndrome selector (the reference numeral 6 in FIG. 1) or "0x00" is inputted selectively to the Galois multiplier 91. Namely, after the shift register 94 is initialized into the coefficients $\sigma$_COEF: $\sigma 1 \sim \sigma 10$ according to the initial signal FIRST_FLAG, the Galois multiplication operation for the coefficients $\sigma$_COEF of the error locator polynomial and the syndrome value SYND are performed, and the Galois addition operation for this multiplied value and the intermediate value stored prior in the shift register 94 is performed to update the coefficients $\Omega$_COEF: $\Omega 1 \sim \Omega 10$ of the error evaluator polynomial.

Figure 10:
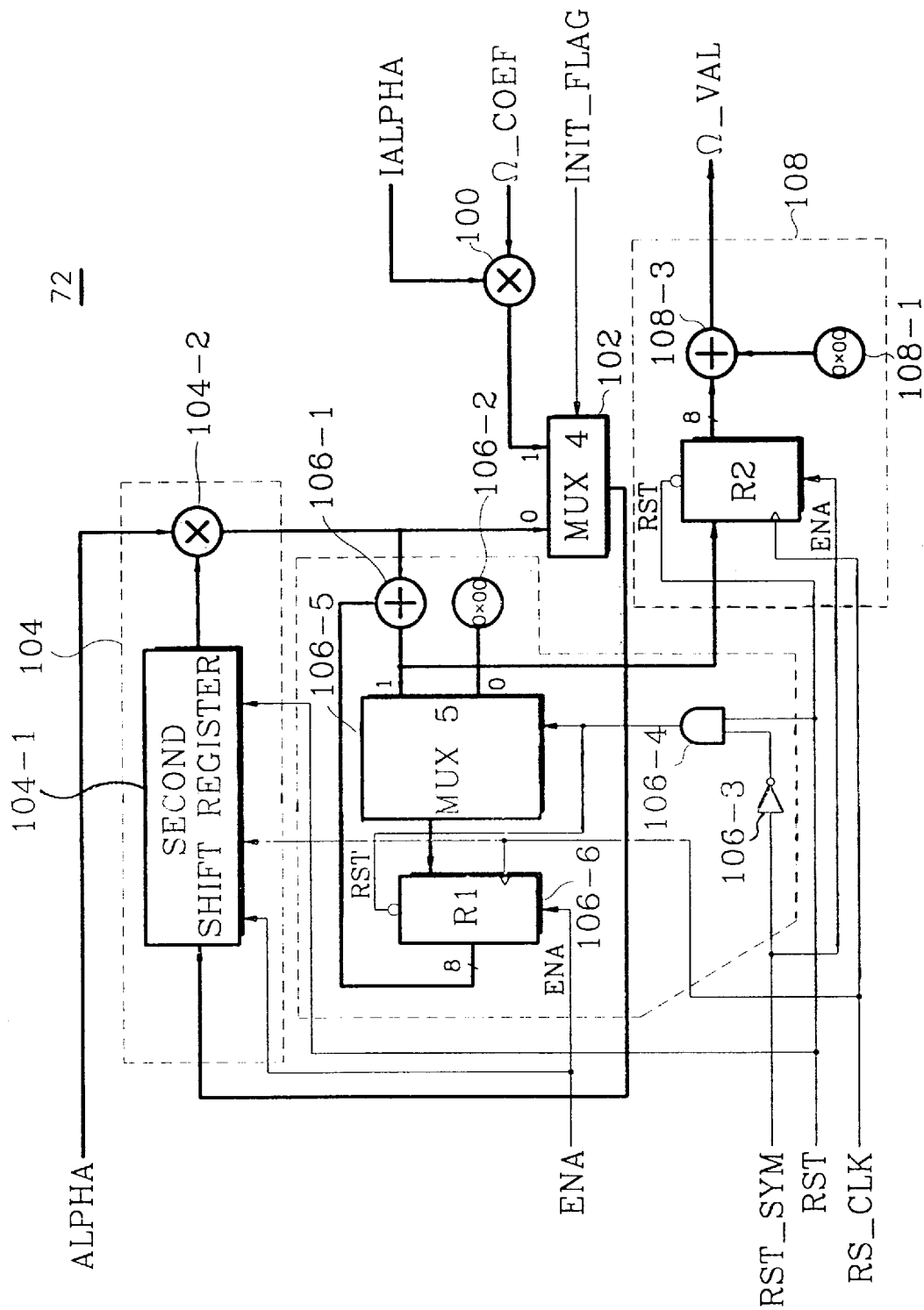
FIG. 10 is a block diagram of the error evaluator polynomial evaluating unit shown in FIG. 7.

FIG. 10 shows a block diagram according to an embodiment of the error evaluator polynomial evaluating unit 72 in FIG. 7. The error evaluator polynomial evaluating unit 72 comprises a first Galois multiplier 100, a term selector 102, an order update unit 104, a term operator 106, and an error evaluation output unit 108. In addition, the order update unit 104 comprises a shift register 104-1 and a Galois multiplier 104-2. The term operator 106 comprises a Galois adder 106-1, a ROM 106-2 for storing 0x00, an inverter 106-3, an AND gate 106-4, a sum register 106-5, and a multiplexer 106-6. In addition, the error evaluation value output unit 108 comprises a sum register 108-1, a ROM 108-2 for storing "0x01", and a Galois adder 108-3.

In FIG. 10, an output from the first multiplexer 80-11 of the common element storing unit 70, namely initial roots $\alpha^{-207}$, $\alpha^{-207/2}$, $\alpha^{-207/3}$, $\cdots$, $\alpha^{-207/10}$ for evaluating the highest order receipt symbol, are inputted selectively in RS clock RS_CLK units to one input terminal of the first Galois multiplier 100 according to the initial selecting signal EIA_SEL. In addition, the coefficient $\Omega$_COEF of the error evaluator polynomial calculated in the error evaluator polynomial calculating unit (the reference numeral 71 in FIG. 7) is inputted sequentially in the other input terminal. The first Galois multiplier 100 performs the Galois multiplication operation for these two values, and outputs sequentially initial term values INITIAL $\Omega_1 \alpha^{-207}$, $\Omega_2 \alpha^{-207*2}$, $\Omega_3 \alpha^{-207*3}$, $\Omega_4 \alpha^{-207*4}$, $\Omega_5 \alpha^{-207*5}$, $\Omega_6 \alpha^{-207*6}$, $\Omega_7 \alpha^{-207*7}$, $\Omega_8 \alpha^{-207*8}$, $\Omega_9 \alpha^{-207*9}$, $\Omega_{10} \alpha^{-207*10}$ to the term selector 102.

The term selector 102 selects the initial term value according to the initial signal INIT_FLAG, and outputs it to the shift register 104-1 comprising 10 registers of the order update unit 104. The shift register 104-1 shifts the initial term value INITIAL according to the RS clock RS_CLK, and outputs the last value to the second Galois multiplier 122.

Meanwhile, the second multiplexer 80-22 of the common element storing unit (the reference numeral 70 in FIG. 7) selects sequentially the values $\alpha^1$, $\alpha^2$, $\alpha^3$, $\alpha^4$, $\alpha^5$, $\alpha^6$, $\alpha^7$, $\alpha^8$, $\alpha^9$, $\alpha^{10}$ stored in the second ROMs 80-12~80-21, and outputs them to the Galois multiplier 104-2. The Galois multiplier 104-2 systematically performs the Galois multiplication operation for the term value of the shifter register 104-1 and the ROM value for updating the order, and outputs the result, $\Omega_1\alpha^{-206}$, $\Omega_2\alpha^{-206*2}$, $\Omega_3\alpha^{-206*3}$, $\Omega_4\alpha^{-206*4}$, $\Omega_5\alpha^{-206*5}$, $\Omega_6\alpha^{-206*6}$, $\Omega_7\alpha^{-206*7}$, $\Omega_8\alpha^{-206*8}$, $\Omega_9\alpha^{-206*9}$, $\Omega_{10}\alpha^{-206*10}$ according to RS clock $RS\_CLK$.

The Galois adder 106-1 of the term operator 106 adds the term value outputted from the Galois multiplier 104-2 with the feedback value from the sum register 106-6, and outputs the result to the multiplexer 106-5. The sum register 106-6 latches the value outputted from the multiplexer 106-5, and feeds it back to the Galois adder 106-1. The sum (SUM1= $\Omega_1\alpha^{-206}$, $\Omega_2\alpha^{-206*2}$, $\Omega_3\alpha^{-206*3}$, $\Omega_4\alpha^{-206*4}$, $\Omega_5\alpha^{-206*5}$, $\Omega_6\alpha^{-206*6}$, $\Omega_7\alpha^{-206*7}$, $\omega_8\alpha^{-206*8}$, $\Omega_9\alpha^{-206*9}$, $\Omega_{10}\alpha^{-206*10}$) from the first to eighth terms of the error evaluator polynomial for the highest order receipt symbol R_206 is outputted through in the term operator 106.

The sum register 108-1 of the error evaluation value output unit 108 is an enable state by the symbol reset signal RST_SYM, latches the sum SUM1 outputted from the Galois adder 106-1, and outputs it to the Galois adder 108-3. The Galois adder 108-3 performs the Galois addition operation for the sum value SUM1 and the value "0x01" corresponding to the 0 order coefficient $\Omega_0$ loaded from the ROM 108-2, and outputs the value $\Omega(\alpha^{-206})$ for processing the error evaluation for the first receipt symbol R_206 as the evaluation value $\Omega\_VAL$ of the error evaluator polynomial.

Next, to process the error evaluation of the receipt symbol R_205, the values, $\Omega_1\alpha^{-206*1}$, $\Omega_2\alpha^{-206*2}$, $\Omega_3\alpha^{-206*3}$, $\Omega_4\alpha^{-206*4}$, $\Omega_5\alpha^{-206*5}$, $\Omega_6\alpha^{-206*6}$, $\Omega_7\alpha^{-206*7}$, $\Omega_8\alpha^{-206*8}$, $\Omega_9\alpha^{-206*9}$, $\Omega_{10}\alpha^{-206*10}$, outputted from the Galois multiplier 104-2 of the order update unit 104 are selected by the term selector 102, and the selectant is outputted to the shift register 104-1.

The shift register 104-1 shifts the output from the term selector 102 according to the RS clock RS_CLK, and outputs it to the Galois multiplier 104-2. The Galois multiplier 104-2 performs the Galois multiplication operation for this outputted value and the update roots $\alpha^1$, $\alpha^2$, $\alpha^3$, $\alpha^4$, $\alpha^5$, $\alpha^6$, $\alpha^7$, $\alpha^8$, $\alpha^9$, $\alpha^{10}$ for updating the order outputted from the common element storing unit (the reference numeral 70 in FIG. 7).

Then, the values $\Omega_1\alpha^{-205*1}$, $\Omega_2\alpha^{-205*2}$, $\Omega_3\alpha^{-205*3}$, $\Omega_4\alpha^{-205*4}$, $\Omega_5\alpha^{-205*5}$, $\Omega_6\alpha^{-205*6}$, $\Omega_7\alpha^{-205*7}$, $\Omega_8\alpha^{-205*8}$, $\Omega_9\alpha^{-205*9}$, $\Omega_{10}\alpha^{-205*10}$ from the Galois multiplier 104-2 are inputted into the term operator 106 and the term selector 102 to update their order. The term operator 106 and the term selector 102 perform the error evaluation process for repeating the above described operation, and thereby to obtain the error evaluation value $\Omega(\alpha^{-205})$ through the error evaluation output unit 108.

Continuously, the operation for processing the error evaluation described above for the receipt symbol R_205 is repeated to the last symbol R_0 of the codeword.

Figure 11:
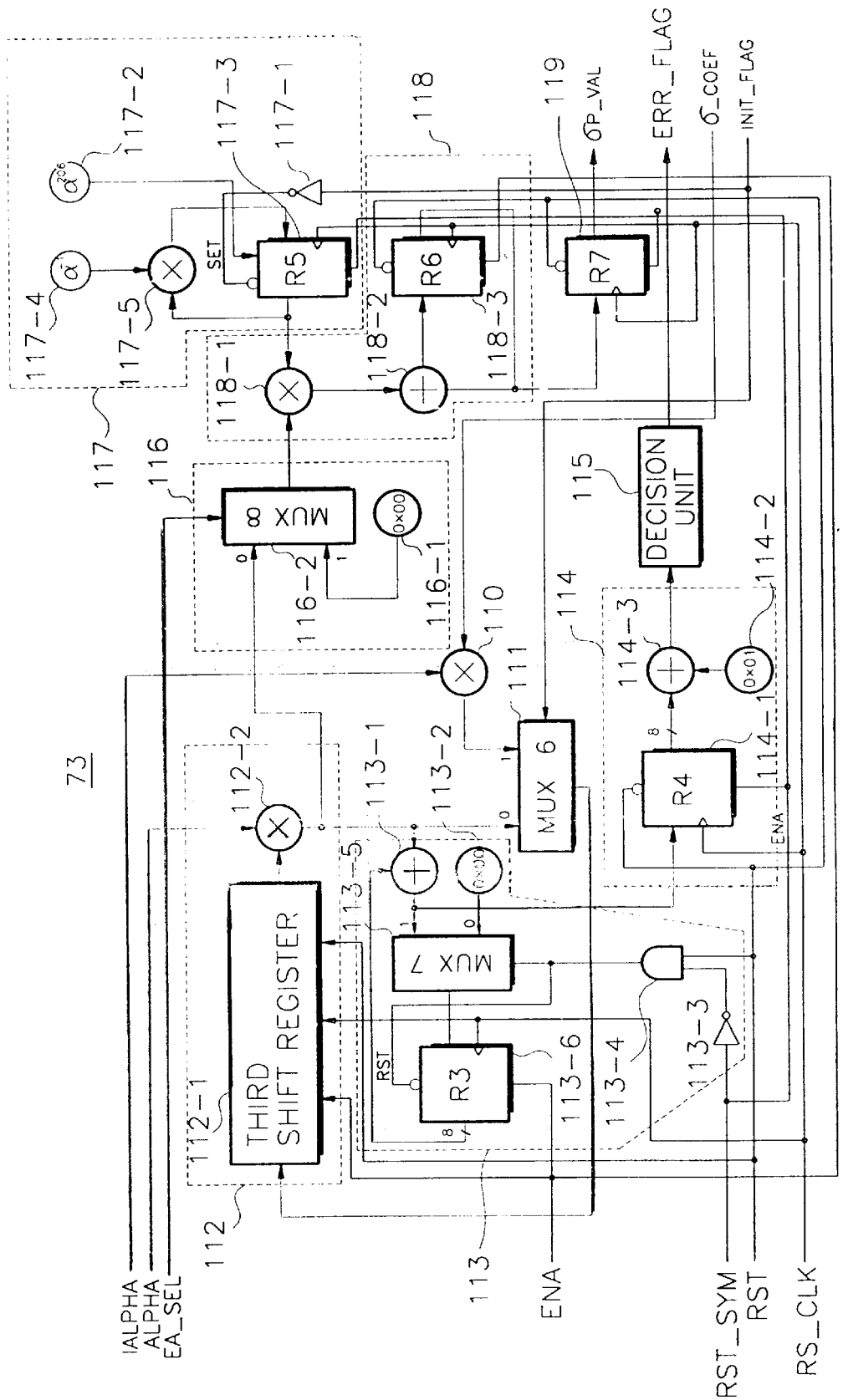
FIG. 11 is a block diagram of the error locator polynomial evaluating unit shown in FIG. 7.

FIG. 11 shows a block diagram according to an embodiment of the error locator polynomial evaluating unit 73 in FIG. 7. The error locator polynomial evaluating unit 73 comprises an update unit further comprising an initialization unit 110, a term selector 111, and a first order update unit 112, a first evaluating unit for evaluating the error locator polynomial $\sigma(X)$ and outputting error location signal ERR_FLAG, further comprising a first multiple term operator 113, a second multiple term operator 114, and an error decision unit 115, and a second evaluating unit for evaluating the error location differentiation polynomial $\sigma'(X)$ and outputting a differentiation evaluation value $\sigma p\_VAL$, further comprising an odd order term selector 116, a second update unit 117, a third multiple operator 118, and a differentiation evaluation value output unit 119.

Next, an operation of the error locator polynomial evaluating unit 73 illustrated in FIG. 11 will be described by the following three processes.

(1) An Initialization Process

Reciprocal values IALPHA of the Galois field, $\alpha^{-207*1}$, $\alpha^{-207*2}$, $\alpha^{-207*3}$, $\alpha^{-207*4}$, $\alpha^{-207*5}$, $\alpha^{-207*6}$, $\alpha^{-207*7}$, $\alpha^{-207*8}$, $\alpha^{-207*9}$, $\alpha^{-207/10}$ are inputted selectively from the first multiplexer (the reference numeral 80-11 in FIG. 8) to one input terminal of the Galois multiplier 110 according to the initial selecting signal EIA_SEL generated in RS clock RS_CLK units. In addition, the coefficients $\sigma\_COEF$: $\sigma_1$, $\sigma_2, \ldots, \sigma_{10}$ of the error locator polynomial calculated in the error locator polynomial calculating unit (the reference numeral 71 in FIG. 7) are inputted sequentially in the other input terminal. The Galois multiplier 110 operated in RS clock RS_CLK units, performs the Galois multiplication operation for these two values, and outputs sequentially initialization values INITIAL $\sigma_1\alpha^{-207*1}$, $\sigma_2\alpha^{-207*2}$, $\sigma_3\alpha^{-207*3}$, $\sigma_4\alpha^{-207*4}$, $\sigma_5\alpha^{-207*5}$, $\sigma_6\alpha^{-207*6}$, $\sigma_7\alpha^{-207*7}$, $\sigma_8\alpha^{-207*8}$, $\sigma_9\alpha^{-207*9}$, $\sigma_{10}\alpha^{-207*10}$, to the term selector 111.

The term selector 111 selects the initialization value according to the initial signal INIT_FLAG, and outputs it to shift register 112-1. The shift register 112-1 shifts the initialization value INITIAL outputted from the term selector 111 according to the RS clock RS_CLK, and outputs it to the Galois multiplier 112-2. Meanwhile, the second multiplexer 80-22 of the common element storing unit (the reference numeral 70 in FIG. 7) selects sequentially the values $\alpha^1$, $\alpha^2$, $\alpha^3$, $\alpha^4$, $\alpha^5$, $\alpha^6$, $\alpha^7$, $\alpha^8$, $\alpha^9$, $\alpha^{10}$ from the second ROMs 80-12~80-21 according to the update selecting signal EA_SEL generated in RS clock RS_CLK units, and outputs them to the Galois multiplier 112-2. The Galois multiplier 112-2 performs the Galois multiplication operation for the initialization value INITIAL outputted from the shift register 112-1 and the update root ALPHA, in RS clock RS_CLK units, respectively, and systematically outputs the result, $\sigma_1\alpha^{-206*1}$, $\sigma_2\alpha^{-206*2}$, $\sigma_3\alpha^{-206*3}$, $\sigma_4\alpha^{-206*4}$, $\sigma_5\alpha^{-206*5}$, $\sigma_6\alpha^{-206*6}$, $\sigma_7\alpha^{-206*7}$, $\sigma_8\alpha^{-206*8}$, $\sigma_9\alpha^{-206*9}$, $\sigma_{10}\alpha^{-206*10}$.

(2) An Evaluation Process for Generating Error Location Signal (ERR_FLAG)

The Galois adder 113-1 of the multiple term operator 113 performs the Galois addition operation for the term value outputted from the Galois multiplier 112-2 and the feedback value from the sum register 113-6, and outputs the result to the multiplexer 113-5. The multiplexer 113-5 selects the value outputted from the Galois adder 113-1 or "0x00" of the ROM 113-2 according to the signal outputted by the logical AND operation for the reset signal RST and an inverted signal of the symbol reset RST_SYM, and outputs the selected value to the sum register 113-6. The sum register 113-6 latches the value outputted from the multiplexer 113-5 according to the RS clock RS_CLK, feeds it back to the Galois adder 113-1. The output signal of the AND gate 113-4 resets the sum register 113-6. Accordingly, the term sum (SUM1=$\sigma_1\alpha^{-206*1}$, $\sigma_2\alpha^{-206*2}$, $\sigma_3\alpha^{-206*3}$, $\sigma_4\alpha^{-206*4}$, $\sigma_5\alpha^{-206*5}$, $\sigma_6\alpha^{-206*6}$, $\sigma_7\alpha^{-206*7}$, $\sigma_8\alpha^{-206*8}$, $\sigma_9\alpha^{-206*9}$, $\sigma_{10}\alpha^{-206*10}$, of the first to tenth orders of the error locator polynomial $\sigma(X)$ is calculated in the first multiple term operator 113.

Meanwhile, the sum register 114-1 of the second multiple term operator 114 enabled by the symbol reset RST_SYM, latches the sum value SUM1 outputted from the first multiple term operator 113, and outputs it to the Galois adder 114-3. The Galois adder 114-3 performs the Galois addition operation for the sum value and the value "0×00" corresponding to the 0 order coefficient $\sigma_0$ outputted from the ROM 114-2, and outputs the result as the location evaluation value $\sigma\_VAL$ of the error locator polynomial.

The decision unit 115 receives the location evaluation value $\sigma\_VAL$ outputted from the second multiple term operator 114, generates the error location signal ERR_FLAG as "1" to indicate an error generation if this evaluation value is "0", whereas the decision unit 115 generates the error location signal ERR_FLAG as "0" to indicate the no-error generation if this evaluation value is not "0".

In the above, the evaluation process have described a procedure for determining the error generation location for the receipt symbol R_206. The error location signal ERR_FLAG for the remaining receipt symbols is generated by the same procedure.

(3) An Evaluation Process for Outputting Differentiation Evaluation Value

The multiplexer 116-2 of the odd order term selector 116 uses the least significant bit of the update root selecting signal EA_SEL as the selecting signal EA_SEL0. The multiplexer 116-2 receives the term value outputted from the Galois multiplier 112-2 and the value "0×00" outputted from the ROM 116-1, selects sequentially $\sigma_1\alpha^{-206*1}$, 0×00, $\sigma_3\alpha^{-206*3}$, 0×00, $\sigma_5\alpha^{-206*5}$, 0×00, $\sigma_7\alpha^{-206*7}$, 0×00, $\sigma_9\alpha^{-206*9}$, 0×00, and outputs them to the Galois multiplier 118-1 of the third multiple term operator 118.

Meanwhile, the register 117-3 of the second order update unit 117 is set by a signal for inverting the initialization signal INIT_FLAG, being enabled by the symbol reset signal RST_SYM to latch the output from the Galois multiplier 117-5 according to the RS clock RS_CLK. In addition, the register 117-3 loads the value $\alpha^{206}$ stored in the ROM 117-2, and outputs it to the Galois multiplier 118-1 of the third multiple term operator 118 and the Galois multiplier 117-5. Here, Galois multiplier 117-5 performs the Galois multiplication operation for the value $\alpha^{-1}$ stored in the ROM 117-4 and the value outputted from the register 117-3, and feeds back the result to the register 117-3.

The Galois multiplier 118-1 of the third multiple term operator 118 performs the Galois multiplication operation for $\alpha^{206}$ outputted from the register 117-3 and the value outputted from the odd order term selector 116, and outputs sequentially the values $\sigma_1\alpha^{-206*1}\alpha^{206}$, 0×00, $\sigma_3\alpha^{-206*3}\alpha^{206}$, 0×00, $\sigma_5\alpha^{-206*5}\alpha^{206}$, 0×00, $\sigma_7\alpha^{-206*7}\alpha^{206}$, 0×00, $\sigma_9\alpha^{-206*9}\alpha^{206}$, 0×00 to the Galois adder 118-2 according to the RS clock RS_CLK. The Galois adder 118-2 performs the Galois addition operation for the value outputted from the Galois multiplier 118-1 and the value outputted from the sum register 118-3, and feeds back the result to the sum register 118-3. The sum register 118-3 receives the value outputted from the Galois adder 118-2 according to the RS clock RS_CLK, and is reset by the symbol reset signal $RST\_{SYM}$.

The differentiation evaluation value output unit 119 is enabled by the symbol reset signal RST_SYM, and outputs the differentiation evaluation value $\sigma p\_VAL$ for the receipt symbol by latching the value outputted from the Galois adder 118-2, namely the differentiation evaluation value $\sigma p\_VAL$.

That is, the differentiation evaluation value for the receipt symbol R_206 is outputted as $\sigma_1\alpha^{-206*1}\alpha^{206}+\sigma_3\alpha^{-206*3}\alpha^{206}+\sigma_5\alpha^{-206*5}\alpha^{206}-\sigma_7\alpha^{-206*7}\alpha^{206}+\sigma_8\alpha^{-206*9}\alpha^{206}=\alpha^{206}$ odd $(\sigma(\alpha^{-206}))$. For the remaining symbols, the $\alpha^i$ order of the second order update unit 117 is decreased by units of 1, and is multiplied by the odd order term, so that differentiation evaluation value $\sigma p\_VAL$ is obtained through the same operation.

Figure 12:
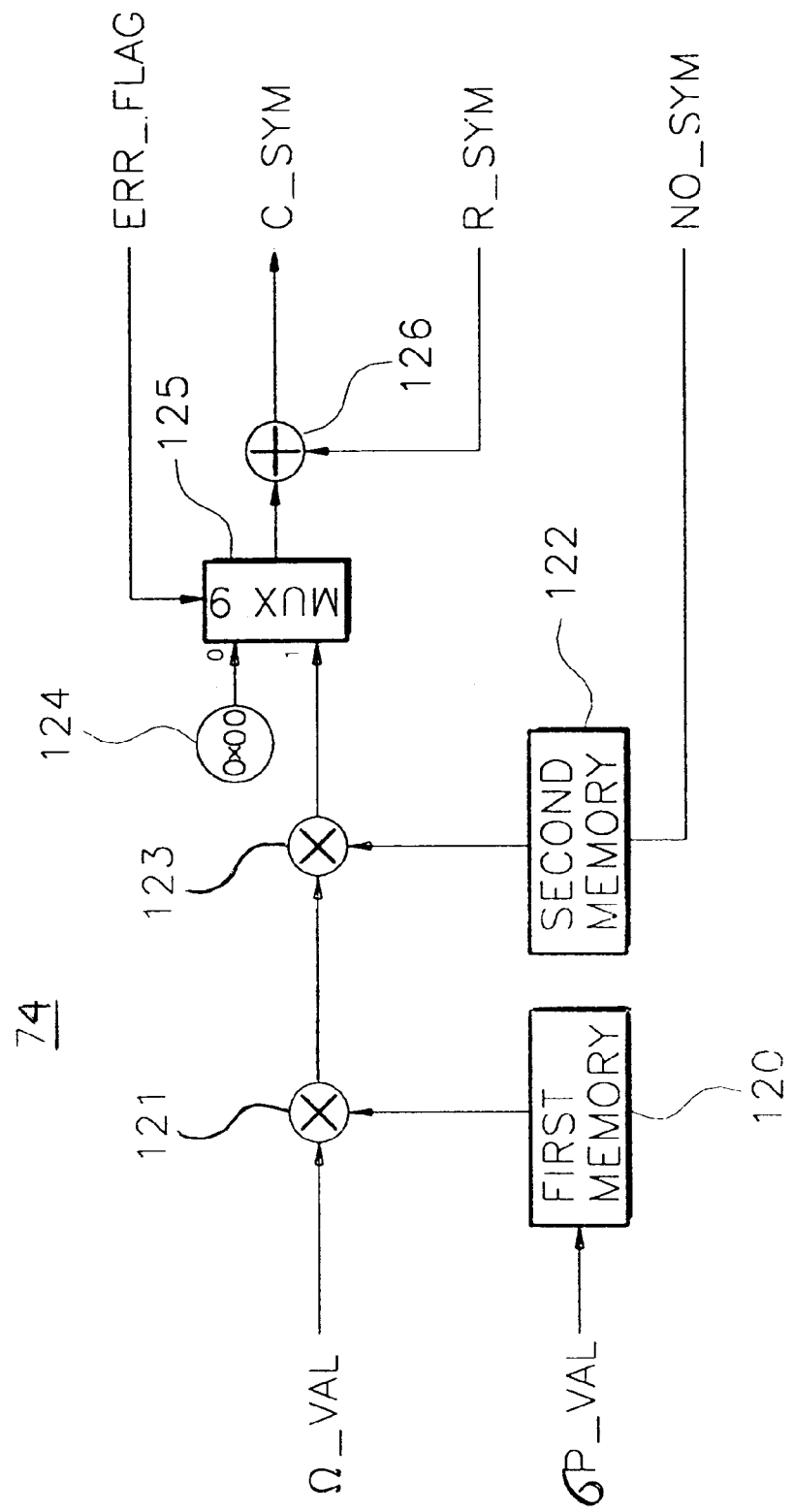
FIG. 12 is a block diagram in accordance with one embodiment of the error value calculator/corrector shown in FIG. 7.

FIG. 12 shows a block diagram according to a first embodiment of the error value calculating and correcting unit 74 in FIG. 7. The error value calculating and correcting unit 74 comprises a first memory 120, a first Galois multiplier 121, a second memory 122, a second Galois multiplier 123, a ROM 124 for storing "0×00", a multiplexer 125, and a Galois adder 126.

In FIG. 12, the first memory 120 stores a reciprocal value for a predetermined differentiation evaluation value in the form of look-up table, and outputs a reciprocal $(1/\sigma'(\alpha^{-i}))$ of the differentiation evaluation value $(\sigma'(\alpha^{-i}))$ corresponding to the differentiation evaluation value $\sigma p\_VAL$ from the error locator polynomial evaluating unit (the reference numeral 73 in FIG. 7) to the first Galois multiplier 121.

The first Galois multiplier 121 performs the Galois multiplication operation for the error evaluation value $\Omega\_VAL$ outputted from the error locator polynomial evaluating unit (the reference numeral 73 in FIG. 7) and the reciprocal differentiation evaluation value $(1/\sigma'(\alpha^{-i}))$ outputted from the first memory 120.

The second memory 122 outputs an element $\alpha^i$ of the Galois field corresponding to the symbol order according to a symbol number signal NO_SYM provided from the controller (the reference numeral 10 in FIG. 1). The second Galois multiplier 123 performs the Galois multiplication operation for the output value from the first Galois multiplier 121 and the Galois field element $\alpha^i$ outputted from the second memory 122, and outputs the result as an error value $e_i$ to the multiplexer 125.

The multiplexer 125 selects "0×00" stored in the ROM 124 according to the error location signal ERR_FLAG or the error value $e_i$ of the second Galois multiplier 123, and outputs it to the Galois adder 126. The Galois adder 126 performs the Galois addition operation for a receipt symbol R_SYM and the output value from the multiplexer 125, and outputs the result as an error-corrected recovered symbol C_SYM. Namely, according to the error location signal ERR_FLAG, the error correction is performed by adding the calculated error value to the receipt symbol in which the error is generated.

Figure 13:
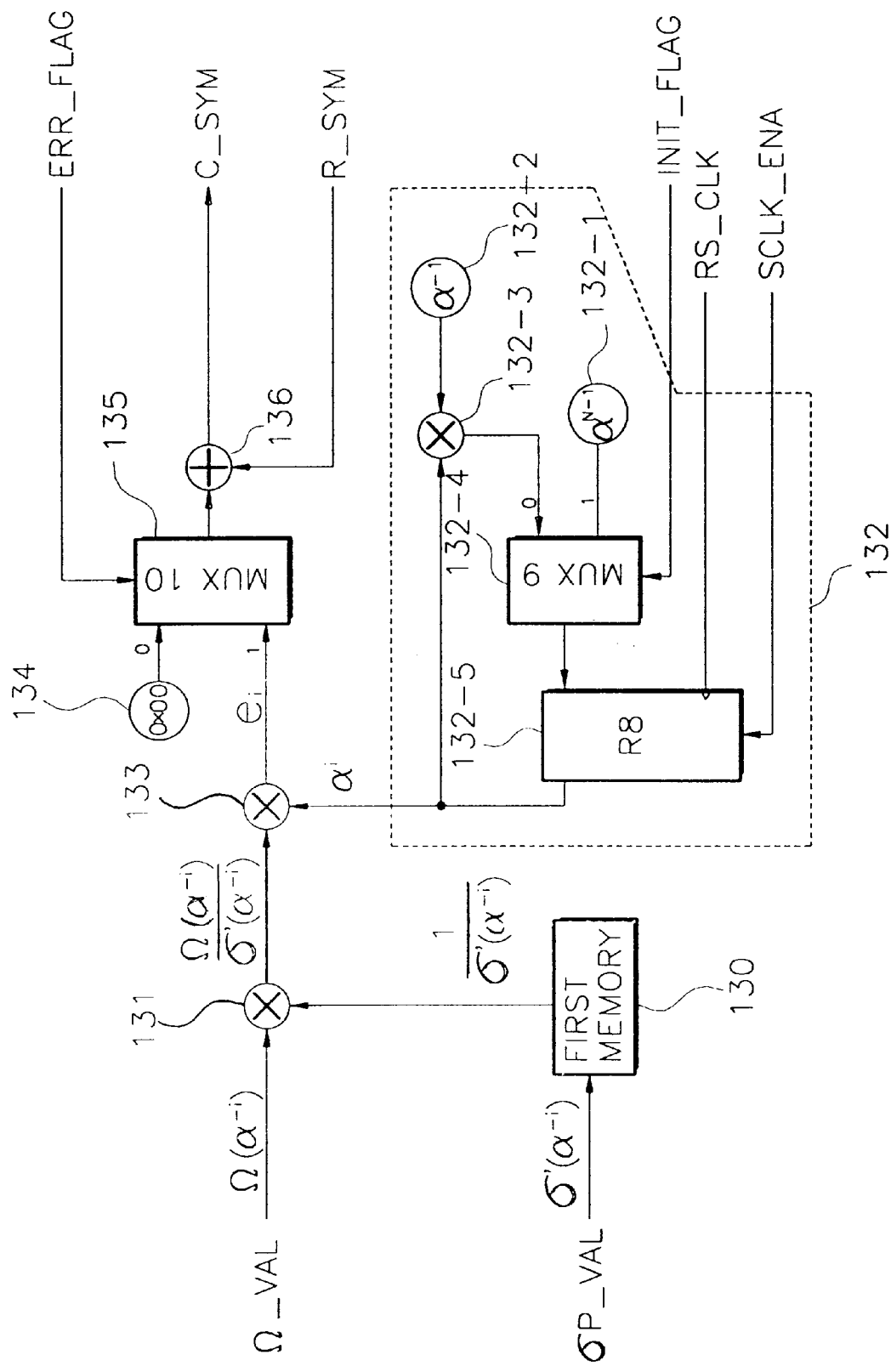
FIG. 13 is a block diagram in accordance with another embodiment of the error value calculator/corrector shown in FIG. 7.

FIG. 13 shows a block diagram according to a second embodiment of the error value calculating and correcting unit 74 in FIG. 7. The error value calculating and correcting unit 74 comprises a first memory 130, a first Galois multiplier 131, a Galois field element output unit 132, a second Galois multiplier 133, a ROM 134 for storing "0×00", a multiplexer 135, and a Galois adder 136. In addition, the Galois field element output unit 132 comprises a first ROM 132-1, a second ROM 132-2, a third Galois multiplier 132-3, a multiplexer 132-4, and a register 132-5.

In FIG. 13, the first ROM 132-1 of the Galois field element output unit 132 stores the highest order primitive element "$\alpha^{N-1}$" of the Reed-Solomon code, and the second ROM 132-2 stores "$\alpha^{-1}$" to decrease the primitive element by order of one. The third Galois multiplier 132-3 receives the "$\alpha^{-1}$" of the second ROM 132-2 and the feedback value, and performs the Galois multiplication operation to output the primitive element of the decreased order decreased by order of one. The multiplexer 132-4 outputs selectively the highest order primitive element of the first ROM 132-1 or the primitive element $\alpha^i$ calculated from the third Galois multiplier 132-3 according to the initial signal INIT_FLAG. The register 132-5 latches the primitive element $\alpha^i$ outputted from the multiplexer 132-4, outputs it to the second Galois multiplier 133, and simultaneously feeds back it to the third Galois multiplier 132-3.

Next, an operation of the error value calculating and correcting unit 74 illustrated in FIG. 13 will be described in detail.

First, to calculate an error value for a N−1 order receipt symbol $\gamma_{N-1}$, the multiplexer 132-4 selects the primitive element "$\alpha^{N-1}$" for the highest order symbol of the first ROM 132-1 according to the initial signal INIT_FLAG, and outputs it to the register 132-5. At this time, the register 132-5 enabled by the symbol enable signal SCLK_ENA, receives the primitive element "$\alpha^{N-1}$" by being synchronized with the RS clock RS_CLK. The first memory 130 stores a reciprocal value for a predetermined differentiation evaluation value in the form of look-up table, receives the differentiation evaluation value $\sigma p\_VAL=\sigma'(\alpha^{-(N-1)})$ provided from the error locator polynomial evaluating unit (the reference numeral 73 in FIG. 7), and outputs the corresponding reciprocal value $1/\sigma'(\alpha^{-(N-1)})$ to the first Galois multiplier 131.

The Galois multiplier 131 receives the differentiation evaluation reciprocal value $1/\sigma'(\alpha^{-(N-1)})$ from the first memory 130 and the error evaluation value $\sigma\_VAL=\Omega(\alpha^{-(N-1)})$ provided from the error evaluator polynomial evaluating unit (the reference numeral 72 in FIG. 7), and outputs the Galois-multiplied value $\Omega(\alpha^{-(N-1)})/\sigma'(\alpha^{-(N-1)})$. The second Galois multiplier 133 performs the Galois multiplication operation for an output value from the first Galois multiplier 131 and the primitive element value $\alpha^{N-1}$ outputted from the register 132-5, and outputs the result as an error value $e_{N-1}$. From the above processes, the error value $e_{N-1}=\alpha^{N-1}(\Omega(\alpha^{-(N-1)})/\sigma'(\alpha^{-(N-1)}))$ for the highest order symbol $\gamma_{N-1}$ is calculated.

To calculate an error value for the next N−2 order receipt symbol $\gamma_{N-2}$, the third Galois multiplier 132-3 performs the Galois multiplication operation for the highest primitive element "$\alpha^{N-1}$" outputted from the register 132-5 and the "$\alpha^{-1}$" of the second ROM 132-2, and outputs the result as a primitive element "$\alpha^{N-2}$". The multiplexer 132-4 selects and outputs the output value "$\alpha^{N-2}$" from the third Galois multiplier 132-3 according to the initialization signal INIT_FLAG. Meanwhile the first memory 130 for storing reciprocal look-up tables receives the differentiation evaluation value $\sigma p\_VAL=\sigma'(\alpha^{-(N-1)})$ provided from the error locator polynomial evaluating unit (the reference numeral 73 in FIG. 7), and outputs the corresponding reciprocal value $1/\sigma'(\alpha^{-(N-2)})$ to the first Galois multiplier 131.

The first Galois multiplier 131 receives the differentiation evaluation reciprocal value $1/\sigma'(\alpha^{-(N-2)})$ from the first memory 130 and the error evaluation value $\sigma\_VAL=\Omega(\alpha^{-(N-2)})$ provided from the error evaluator polynomial evaluating unit (the reference numeral 72 in FIG. 7), and outputs the Galois-multiplied value $\Omega(\alpha^{-(N-2)})/\sigma'(\alpha^{-(N-2)})$. The second Galois multiplier 133 performs the Galois multiplication operation for the output value from the first Galois multiplier 131 and the primitive element value $\alpha^{N-2}$ outputted from the register 132-5, and outputs the error value $e_{N-2}$. From these processes, the error value $e_{N-2}=\alpha^{N-2}(\Omega(\alpha^{-(N-2)})/\sigma'(\alpha^{-(N-2)}))$ for the N−2 order symbol $\gamma_{N-2}$ is calculated.

Continuously, by repeating the operation such as the above, the primitive element value is decreased by order of one through the third Galois multiplier 132-3, so that the error value of the corresponding primitive element value is obtained.

Figure 14:
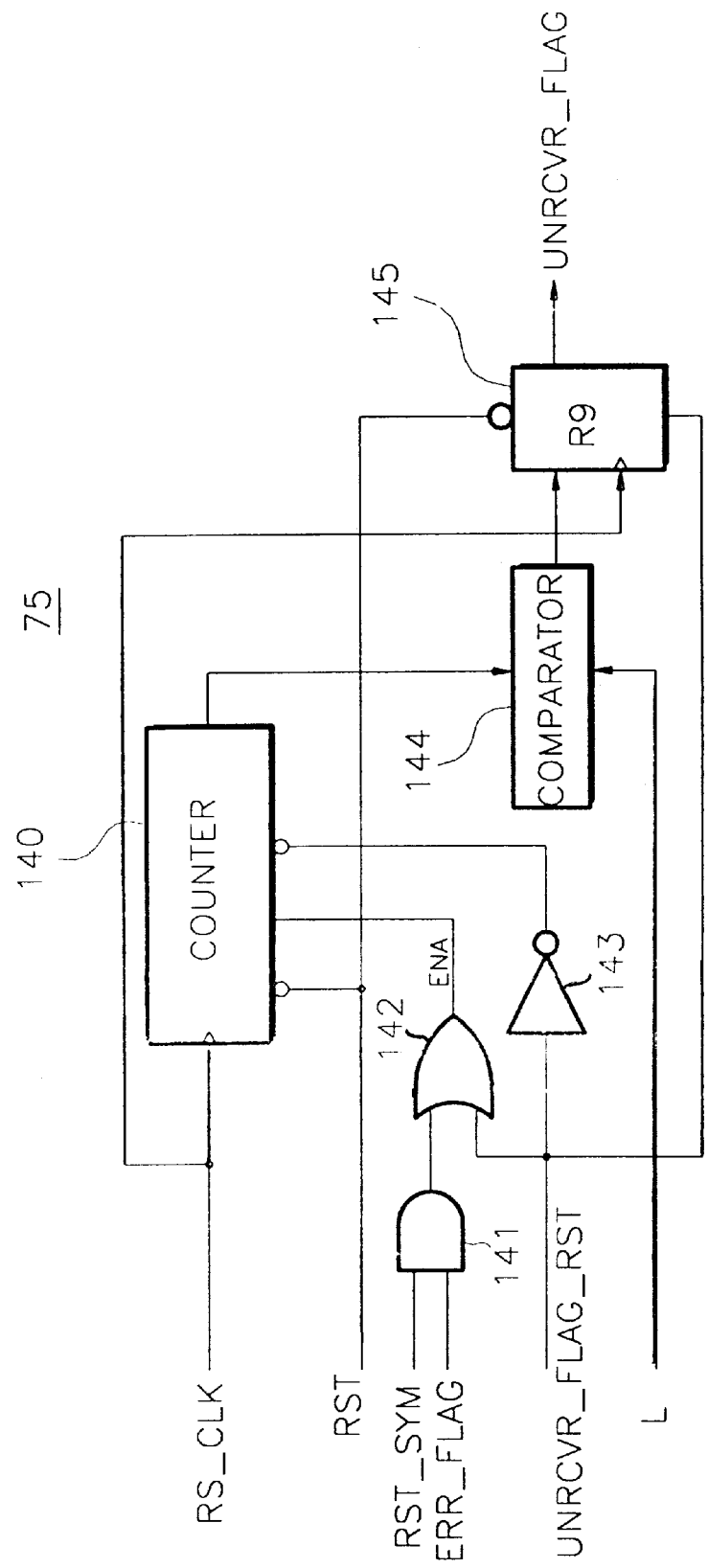
FIG. 14 is a block diagram of the recovery failure decision unit shown in FIG. 7.

FIG. 14 shows a block diagram according to an embodiment of the recovery failure decision unit 75 in FIG. 7. The recovery failure decision unit 75 comprises a counter 140, an AND gate 141, an OR gate 142, an inverter 143, a comparator 144, and a register 145.

In FIG. 14, the counter 140 counts an error location signal ERR_FLAG for indicating an error bit generation, and outputs the number of symbol for which an error is generated. The AND gate 141 performs the logical AND operation for an evaluation request signal EVAL_RST of symbol clock units generated from the controller (the reference numeral 10 in FIG. 1) and the error location signal ERR_FLAG generated from the error locator polynomial evaluator (the reference numeral 73 in FIG. 7), to evaluate them in symbol units. The OR gate 142 performs the logical OR operation for the output from the AND gate 141 and the error correction failure request signal UNRCVR_FLAG_RST, and supplies this result as an enable signal to the counter 140. The inverter 143 inverts the error correction failure request signal UNRCVR_FLAG_RST supplied from the controller 10, and supplies the result as a clear signal to the counter 140. The comparator 144 compares the number of error symbol cnt of the counter 140 to the highest order L of the error locator polynomial outputted from the error locator polynomial calculating unit (the reference numeral 7 in FIG. 1), and outputs a "low" signal if the two values are equivalent, whereas a "high" signal if the two values are not equivalent. The register 145 receives the output signal from the comparator 144, and outputs an error correction failure signal UNRCVR_FLAG.

Namely, the recovery failure decision unit 75 determines a success or failure of the error correction. If the highest order L of the error locator polynomial outputted from the error locator polynomial calculating unit (the reference numeral 7 in FIG. 1) is less than 10, and the number of error generation symbol of the counter 140 is equal to the value L, the error-corrected symbol is correctly recovered.

Figure 15:
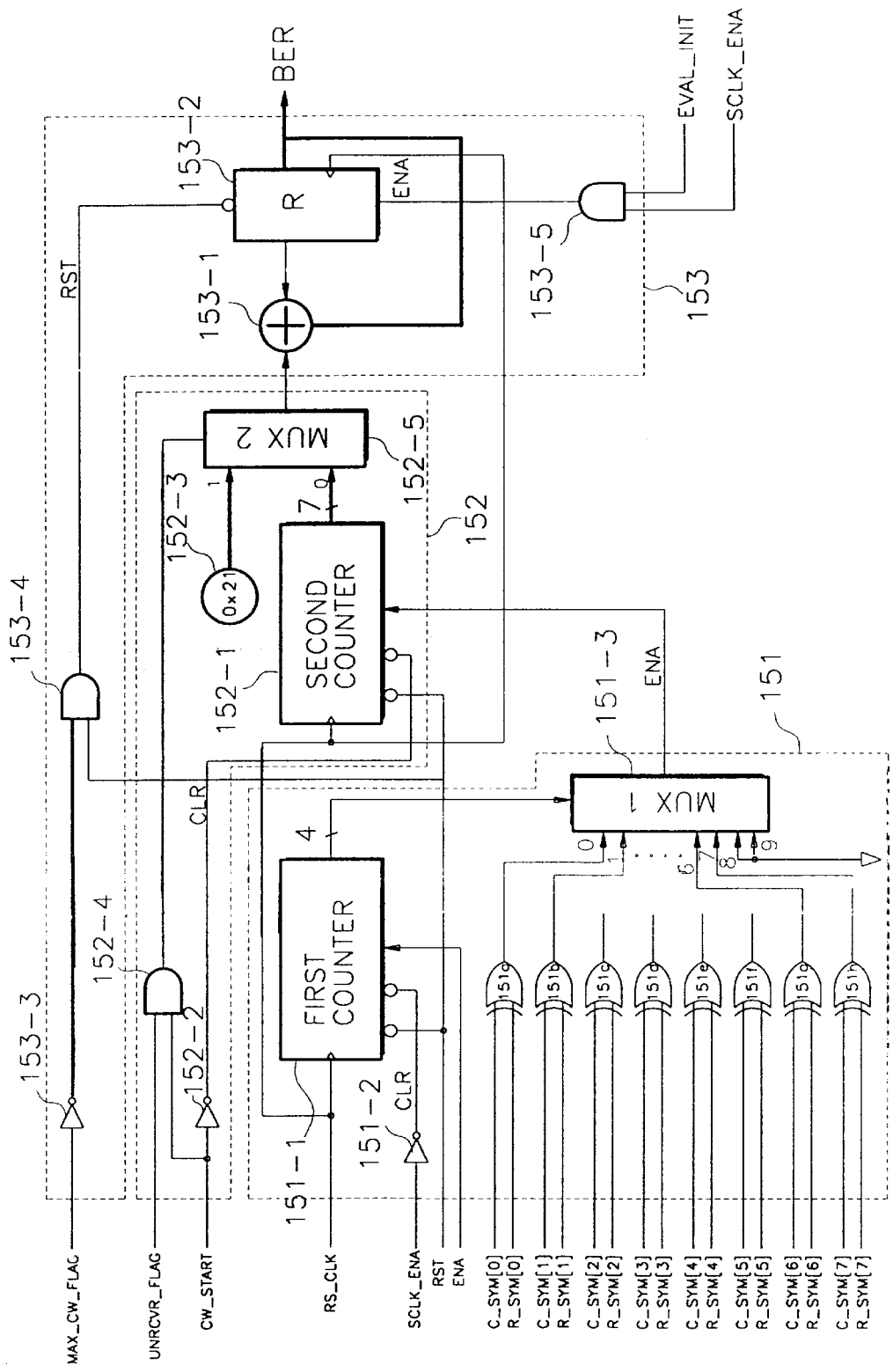
FIG. 15 is a block diagram of the bit error rate calculator shown in FIG. 1.

FIG. 15 shows a block diagram according to an embodiment of the BER calculator 9 in FIG. 1. The BER calculator 9 comprises an error bit detector 151, an error bit counter 152, and error bit number calculator 153. In addition, the error bit detector 151 comprises a first counter 151-1, a first inverter 151-2, exclusive OR gates 151a~151h, and a first multiplexer 151-3. In addition, the error bit counter 152 comprises a second counter 152-1, and a second inverter 152-2, a ROM 152-3 for storing "0x21", a first AND gate 152-4, and a second multiplexer 152-5. In addition, the bit error number calculator 153 comprises an adder 153-1, a register 153-2, a third inverter 153-3, a second AND gate 153-4, and a third AND gate 153-5.

In FIG. 15, the first counter 151-1 of the error bit detector 151 is a 4-bit counter, cleared at each symbol units, which supplies the counting values 0, 1, 2, . . . , 7, 8, 9, 0, 1, . . . as the bit selecting signal SEL_BIT to the first multiplexer 151-3 by being synchronized with the RS clock RS_CLK. The eight exclusive OR gates 151a~151h perform an exclusive OR operation for the receipt symbol bits R_SYM[0] ~R_SYM[7] outputted from the FIFO buffer (the reference numeral 3 in FIG. 1) and the error-corrected symbol bits C_SYM[0]~C_SYM[7] outputted from the error corrector (the reference numeral 8 in FIG. 1), respectively, to output "0" to the first multiplexer 151-3 if two bits are equivalent, whereas "1" to the multiplexer 151-3 if two bits are not equivalent. The first multiplexer 151-3 receives the output from the eight exclusive logical OR gates 151a~151h through its first to eighth terminals, selects them systematically according to the bit selecting signal SEL_BIT, and outputs them to the second counter 152-1. At this time, the ninth and tenth terminals of the first multiplexer 151-3 are in a state of grounding connection.

In the error bit counter 152, the second counter 152-1 enabled when the output signal from the first multiplexer 151-3 is "1", performs a counting operation by being synchronized with the RS clock RS_CLK. Namely, the second counter 152-1 counts only if the bit of the receipt symbol R_SYM[i] and the bit of the error-corrected symbol C_SYM[i] differ from each other, in order to detect the number of the generated error bit. The second counter 152-1, as a 7-bit counter, can count up to 80 bits that can be generated from the 10 symbols in which the error can be corrected for each codeword. The second counter 152-1 is cleared by a codeword start signal CW_START, which is generated for each codeword. The first AND gate 152-4 performs the logical AND operation for a recovery failure signal UNRCVR_FLAG (which is 'low' if the error correction is a success whereas 'high' if not), and a codeword start signal CW_START which is 'high' only during the input of the first symbol of each codeword, and outputs the result as the selecting signal of the multiplexer 152-5. The second multiplexer 152-5, according to the output from the first AND gate 152-4, selectively outputs "0x21" of the ROM 152-3 if the recovered 1 codeword is not corrected, whereas it outputs a first error bit number ERR_NUM1 generated from the 1 codeword outputted from the second counter 152-1, if the recovered 1 codeword is corrected. Here, the value "0x21" stored in the ROM 152-3 represents a case when the number of the generated error exceeds the number of error correction number t(=10). In addition, the value 33 is represented as a hexadeciaml notation when the error is generated in 11 symbols, and the number of error generated in each symbol is 3-bit.

In the error bit number calculator 153, the adder 153-1 adds the first error bit number ERR_SUM1 to a value outputted from the register 153-2, and feeds back the result to the register 153-2. Here, the register 153-2 is enabled only at the start of a codeword in accordance with the result of the logical AND operation for an evaluation start signal EVAL_INIT_FLAG and a symbol enable signal SCLK_ENA, being synchronized with the RS clock RS_CLK, and resets by a predetermined detection period signal (for example, a period signal of "1" at every 100th codeword). Accordingly, at each codeword period, the adder 153-1 outputs total error bit number ERR_NUM2 generated up to the current codeword during the predetermined detection period.

That is, the BER calculator 9 compares the receipt symbol with the error-corrected symbol, in each bit, to count the unlike bits as the error bits for detecting the error bit number ERR_NUM1 in codeword units, considers the error correction failure codeword as 33-bit errors, accumulates the practically-generated error bit number for the error correction success codeword during a predetermined detection period, and updates and outputs the generated error bit number from the start to the current codeword.

The above embodiments relates to a decoder for recovering the Reed-Solomon code having the error correction capability of 10. By changing RS clock, the number of the initial root stored in the ROM or the update root, and the capacity of various types of registers, the embodiments of the present invention can easily be implemented for recovering the Reed-Solomon code having the error correcting capability of multiple of 10.

As described above, according to the present invention, the decoder for recovering the (207, 187) Reed-Solomon code for use in the ATV can be achieved easily by utilizing a VLSI chip.

While this invention has been described in connection with what is presently considered to be the most practical and preferred embodiments, it is to be understood that the invention is not limited to the disclosed embodiment, but, on the contrary, it is intended to cover various modifications and equivalent arrangements included within the spirit and scope of the appended claims.

What is claimed is:

1. A Reed-Solomon decoder for use in ATV for decoding and correcting errors in a received symbol encoded by a Reed-Solomon code having an error correcting capability of t multiples of 10, comprising:
    clock generating means for generating a RS clock as much as t times the rate of a symbol clock;
    input buffering means for latching the received symbol according to the RS clock;
    FIFO buffering means for latching the received symbol provided from said input buffering means according to the RS clock;
    syndrome calculating means for calculating syndrome values from the received symbol provided from said input buffering means according to the RS clock;
    syndrome selecting means for selecting one of the syndrome values supplied from said syndrome calculating means and "0x00" value according to a syndrome selecting signal;
    error locator polynomial calculating means for calculating an error locator polynomial by using the syndrome values supplied from said syndrome selecting means according to the RS clock and supplying coefficients of the error locator polynomial and the highest order thereof;
    error correcting means for generating an error value by using the syndrome values and the coefficients of the error locator polynomial according to the RS clock and supplying an error-corrected recovered symbol by adding the error value to the received symbol supplied from said FIFO buffering means; and
    controlling means for generating a plurality of control signals and controlling said syndrome calculating means, said syndrome selecting means, said error locator polynomial calculating means, and said error correcting means.

2. The Reed-Solomon decoder of claim 1 further comprising bit error rate calculating means for calculating a bit error rate by comparing the received symbol supplied from said FIFO buffering means to the error-corrected recovered symbol in units of bit.

3. The Reed-Solomon decoder of claim 2, wherein said bit error rate calculating means comprises:
    error bit detecting means for comparing the received symbol and the error-corrected recovered symbol in each bit, detecting unequal bits, and outputting the detected bits, in units of a predetermined symbol;
    error bit counting means for counting the detected bits from said error bit detecting means and outputting a first error bit number generated for a predetermined codeword period; and
    error bit number calculating means for receiving the first error bit number from said error bit counting means and outputting a second error bit number generated for a predetermined detection period as the bit error rate.

4. The Reed-Solomon decoder of claim 1, wherein said syndrome calculating means comprises:
    counting means for counting the RS clock and outputting the counted value as an alpha root selecting signal;
    a first storing unit for storing a first group of alpha roots;
    a first syndrome calculating cell for receiving the received symbol supplied from said input buffering means and calculating a first group of syndrome values by using the first group of alpha roots stored in said first storing unit according to the alpha root selecting signal in the RS clock units;

a second storing unit for storing a second group of alpha roots;

a second syndrome calculating cell for receiving the received symbol supplied from said input buffering means and calculating a second group of syndrome values by using the second group of alpha roots stored in said second storing unit according to the alpha root selecting signal in the RS clock units;

first selecting means for sequentially selecting one of the first group of syndrome values according to a first syndrome selecting signal supplied from said controlling means;

second selecting means for sequentially selecting one of the second group of syndrome values according to a second syndrome selecting signal supplied from said controlling means; and third selecting means for selecting one of the output from said first selecting means and the output from said second selecting means according to a third syndrome selecting signal supplied from said controlling means.

5. The Reed-Solomon decoder of claim 4, wherein said first syndrome calculating cell comprises:

a first shift register having a first group of registers, for storing intermediate syndrome values calculated from the first symbol to the second symbol from the last in one codeword, according to the RS clock;

a second shift register having a second group of registers, for storing final syndrome values calculated from the first symbol to the last symbol in the codeword, according to the RS clock;

control signal generating means for generating a plurality of control signals to control said first and second shift registers;

term selecting means for selecting the intermediate syndrome values supplied from said first shift register while receiving the first symbol to the second symbol from the last in the codeword, and selecting the final syndrome values supplied from said second shift register while receiving the last symbol in the codeword; and syndrome term operating means for Galois multiplying the first group of alpha roots selected according to the alpha root selecting signal by the intermediate syndrome values, Galois adding the multiplied value and the received symbol in the RS clock units, and supplying the added value as the intermediate and final syndrome values to said first and second shift registers, respectively.

6. The Reed-Solomon decoder of claim 4, wherein said second syndrome calculating cell comprises:

a first shift register having a first group of registers, for storing intermediate syndrome values calculated from the first symbol to the second symbol from the last in one codeword, according to the RS clock;

a second shift register having a second group of registers, for storing final syndrome values calculated from the first symbol to the last symbol in the codeword, according to the RS clock;

control signal generating means for generating a plurality of control signals to control said first and second shift registers;

term selecting means for selecting the intermediate syndrome values supplied from said first shift register while receiving the first symbol to the second symbol from the last in the codeword and selecting the final syndrome values supplied from said second shift register while receiving the last symbol in the codeword; and syndrome term operating means for Galois multiplying the second group of alpha roots selected according to the alpha root selecting signal by the intermediate syndrome values, Galois adding the multiplied value and the received symbol in the RS clock units, and supplying the added value as the intermediate and final syndrome values to said first and second shift registers, respectively.

7. The Reed-Solomon decoder of claim 1, wherein said error locator polynomial calculating means comprises:

discrepancy calculating means for delaying an updated error locator polynomial, and calculating 2t number of discrepancies by using the syndrome values outputted from said syndrome selecting means and the updated error locator polynomial;

variable generating means for outputting an index and the highest order of the error locator polynomial, under the control of said discrepancy calculating means;

a storing unit for storing reciprocals of late discrepancies in the form of look-up table, and outputting the reciprocal of late discrepancy corresponding to the index;

a first Galois multiplier for Galois multiplying the discrepancy outputted from said discrepancy calculating means by the reciprocal of the late discrepancy outputted from said storing unit;

a shift register for storing an intermediate value used to update the error locator polynomial;

selecting means for selecting one of the last updated error locator polynomial outputted from said discrepancy calculating means and the output of said shift register, and supplying the selectant to said shift register;

a second Galois multiplier for Galois multiplying the output of said first Galois multiplier by the output of said shift register; and a Galois adder for Galois adding the output of said second Galois multiplier and the error locator polynomial delayed by said discrepancy calculating means, and supplying the added value to said discrepancy calculating means as the updated error locator polynomial.

8. The Reed-Solomon decoder of claim 1, wherein said error correcting means comprises:

a common element storing unit for storing t number of initial roots corresponding to a reciprocal of a Galois field element for processing an evaluation from the highest order symbol of the Reed-Solomon code, and for storing t number of update roots corresponding to the Galois field element for updating the order for the next symbol;

an error evaluator polynomial calculating unit for calculating an error evaluator polynomial by Galois multiplying the syndrome values outputted from said syndrome selecting means by the coefficients of the error locator polynomial, and outputting coefficients of the error evaluator polynomial; an error evaluator polynomial evaluating unit for evaluating the error evaluator polynomial by using the coefficients of the error evaluator polynomial, the initial roots and the update roots outputted from said common element storing unit, and outputting the evaluation result as an error evaluation value;

an error locator polynomial evaluating unit for outputting an error location signal by evaluating the error locator polynomial from the coefficients of the error locator polynomial by using the initial roots and the update roots, and for outputting a differentiation evaluation value by evaluating a differentiation polynomial of the error locator polynomial;

an error value calculating and correcting unit for calculating the error value by using the differentiation evaluation value and the error evaluation value, and outputting the error-corrected recovered symbol by adding the error value to the received symbol according to the error location signal; and a recovery failure decision unit for determining whether the error-corrected recovered symbol is correct, and outputting a recovery failure signal according to the result.

9. The Reed-Solomon decoder for use in ATV of claim 8, wherein said common element storing unit comprises:

a first storing unit comprising a first group of storing areas, for storing the initial roots;

a second storing unit comprising a second group of storing areas, for storing the update roots;

a first selector for selecting and outputting sequentially the initial root of said first storing unit according to an initial root selecting signal supplied from said controlling means; and a second selector for selecting and outputting sequentially the update root of said second storing unit according to an update root selecting signal supplied from said controlling means.

10. The Reed-Solomon decoder of claim 8, wherein said error evaluator polynomial calculating unit comprises:

a Galois multiplier for Galois multiplying the coefficients of the error locator polynomial by the syndrome values outputted from said syndrome selecting means;

a Galois adder for Galois adding the output of said Galois multiplier to a feedback value;

a multiplexer for selectively outputting one of the coefficients of the error locator polynomial and the output from said Galois adder, under the control of said controlling means; and a shift register for storing the coefficients of the error evaluator polynomial by shifting the output of said multiplexer being synchronized with the RS clock, and supplying the stored value to said Galois adder as the feedback value.

11. The Reed-Solomon decoder of claim 8, wherein said error evaluator polynomial evaluating unit comprises:

an initializing unit for Galois multiplying the initial roots supplied from said common element storing unit in the RS clock units by the coefficients of the error evaluator polynomial supplied from said error evaluator polynomial calculating unit in the symbol clock units, and outputting the multiplied value as an initial term value;

a term selector for selecting one of the initial term value and an updated intermediate term value under the control of said controlling means;

an order updating unit for updating a term value of the error locator polynomial for the next symbol by the output of said term selector, and outputting the updated intermediate term value;

a term operator for adding term values outputted from said order updating unit during one symbol clock, and outputting the added value; and an error evaluation value outputting unit for adding the output of said term operator to 0 order coefficient of the error locator polynomial, and outputting the added value as the error evaluation value.

12. The Reed-Solomon decoder of claim 8, wherein said error locator polynomial evaluation unit comprises:

an initializing unit for Galois multiplying the initial roots supplied from said common element storing unit in the RS clock units by the coefficients of the error locator polynomial supplied from said error locator polynomial calculating unit in the symbol clock units, and outputting the multiplied value as an initial term value;

a term selector for selecting one of the initial term value and an intermediate term value under the control of said controlling means;

a first order updating unit for updating a term value of the error locator polynomial for the next symbol by the output of said term selector, and outputting the updated term value as the intermediate term value;

a first term operator for adding term values outputted from said first order updating unit during one symbol clock;

a second term operator for adding the output of said first term operator to 0 order coefficient of the error locator polynomial and outputting the added value as the error locator evaluation value;

a decision unit for determining whether an error is generated from the error locator evaluation value outputted from said second term operator, and generating the error location signal;

an odd order term selector for receiving the output of said first order updating unit, and outputting selectively an odd order term of the error locator polynomial;

a second order updating unit for updating the order of an alpha root from the highest order by "1"; and a third term operator for adding the odd order terms outputted from said odd order term selector, Galois multiplying the added value by the output of said second order updating unit, and outputting the multiplied value as the differentiation value.

13. The Reed-Solomon decoder of claim 8, wherein said error value calculating and correcting unit comprises:

a first memory for storing reciprocals of the differentiation evaluation values in the form of look up table, and outputting a reciprocal of the differentiation evaluation value according to the differentiation evaluation value from said error locator polynomial evaluating unit;

a first Galois multiplier for Galois multiplying the error evaluation value outputted from said error evaluator polynomial evaluating unit by the reciprocal of the differentiation evaluation value outputted from said first memory;

a second memory for storing primitive elements of the Galois field in the form of look up table, and outputting the primitive element corresponding to a symbol order therefrom, under the control of said controlling means;

a second Galois multiplier for Galois multiplying the output of said first Galois multiplier by the primitive element outputted from said second memory, and outputting the multiplied value as the error value;

a third memory for storing "0x00";

a multiplexer for selectively outputting one of the "0x00" outputted from said third memory and the error value outputted from said second Galois multiplier according to the error location signal; and a Galois adder for Galois adding the received symbol to the output of said multiplexer and outputting the added value as the error-corrected recovered symbol.

14. The Reed-Solomon decoder of claim 8, wherein said error value calculating and correcting unit comprises:

a first memory for storing reciprocals of the differentiation evaluation values in the form of look up table, and outputting a reciprocal of the differentiation evaluation value according to the differentiation evaluation value from said error locator polynomial evaluating unit;

a first Galois multiplier for Galois multiplying the error evaluation value outputted from said error evaluator polynomial evaluating unit by the reciprocal of the differentiation evaluation value outputted from said first memory;

a second memory for storing a primitive element corresponding to the highest symbol of one codeword;

a third memory for storing $\alpha^{-1}$ to update the primitive element;

a second Galois multiplier for Galois multiplying the $\alpha^{-1}$ of said third memory by a feedback value, and outputting the primitive element of the order decreased by order of one;

a first multiplexer for selectively outputting one of the output of said second memory and the output of said third memory, under the control of said controlling means;

a register for latching the primitive element outputted from said first multiplexer and outputting the latched value to said second Galois multiplier as the feed back value;

a third Galois multiplier for Galois multiplying the primitive element outputted from said register by the output of said Galois multiplier, and outputting the multiplied value as the error value;

a fourth memory for storing "0×00";

a second multiplexer for selectively outputting one of the "0×00" outputted from said fourth memory and the error value outputted from said third Galois multiplier according to the error location signal; and a Galois adder for Galois adding the received symbol to the output of said second multiplexer and outputting the added value as the error-corrected recovered symbol.

* * * * *